(12) United States Patent
Takai

(10) Patent No.: US 6,674,314 B2
(45) Date of Patent: Jan. 6, 2004

(54) INTERPOLATING CIRCUIT, DLL CIRCUIT AND SEMICONDUCTOR INTEGRATED CIRCUIT

(75) Inventor: Yasuhiro Takai, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/241,986

(22) Filed: Sep. 12, 2002

(65) Prior Publication Data
US 2003/0052718 A1 Mar. 20, 2003

(30) Foreign Application Priority Data
Sep. 19, 2001 (JP) ........................... 2001-285508

(51) Int. Cl.$^7$ ............................. H03L 7/06; H03H 11/16
(52) U.S. Cl. ..................... 327/158; 327/161; 327/233; 327/236
(58) Field of Search ................... 327/231, 233, 327/234, 236, 244, 149, 150, 151, 158, 159, 160, 161; 375/355

(56) References Cited

U.S. PATENT DOCUMENTS 6,125,157 A * 9/2000 Donnelly et al. ........... 375/371
6,359,486 B1 * 3/2002 Chen ........................ 327/231

FOREIGN PATENT DOCUMENTS

JP      A 2001-56723    2/2001    ............. G06F/1/10

* cited by examiner

Primary Examiner—Tuan T. Lam
(74) Attorney, Agent, or Firm—Hayes Soloway P.C.

(57) ABSTRACT

Disclosed is an interpolating circuit for producing an output signal having a delay time corresponding to a value obtained by performing interior division of a phase difference between entered first and second signals by a preset interior division ratio. The interpolating circuit includes a waveform synthesis unit and a bias control unit. The waveform synthesis unit includes an OR gate, which receives the first and second signals, for outputting the logic OR between these two signals; a first switch element inserted between a node, which is connected to an output terminal, and a first power supply and turned on and off by the output signal of the OR gate; a series circuit comprising a first constant-current source and a second switch element turned on and off by the first signal; and a series circuit comprising a second constant-current source and a third switch element turned on and off by the second signal; the series circuits being connected in parallel between the output node and a second power supply. On the basis of control signals that decide the interior division ratio, the bias control unit performs control in such a manner that current-path switches are turned on and off so that first and second current values, which are the totals of current values, will flow into the first and second constant-current sources, respectively.

22 Claims, 15 Drawing Sheets

ONLY ONE BIT CHANGES AT A TIME

INTERPOLATING CIRCUIT, DLL CIRCUIT AND SEMICONDUCTOR INTEGRATED CIRCUIT

FIELD OF THE INVENTION

This invention relates to a semiconductor integrated circuit having a DLL (delay-locked loop) for outputting a clock signal synchronized to an input clock. More particularly, the invention relates to an interpolating circuit for performing a phase adjustment, a DLL having this interpolating circuit, and a semiconductor integrated circuit, such as a DDR-SDRAM, having a DLL.

DESCRIPTION OF THE RELATED ART

BACKGROUND OF THE INVENTION

A DLL (delay-locked loop) includes a delay circuit which receives a reference clock signal as an input and which has multiple taps for outputting clock signals exhibiting different delay times, a switch for selecting two clock signals by selecting taps of the delay circuit, an interpolating circuit for outputting a signal having a phase obtained by performing interior division of the phase difference between the two clock signals, a phase detector for detecting a phase difference between the output signal of the interpolating circuit and the reference clock, and a counter for counting up or counting —down based upon an output (UP/DN) of the phase detector, whereby an output clock signal synchronized to the reference clock signal is obtained. The basic structure of such a DLL will be described with reference to FIG. 3 used in describing the present invention.

As shown in FIG. 3, a delay circuit 10 is a delay circuit (termed also as delay line), to which a signal is input, for outputting a signal, which is obtained by delaying the input signal, from a tap selected from among a plurality of taps, the delay time thereof different from one another. A multiplexer 20o is a switch for selecting and outputting one odd-phase signal (odd) output from an odd-numbered tap of the delay circuit 10, and a multiplexer 20e is a switch for selecting and outputting one even-phase signal (even) output from an even-numbered tap of the delay circuit 10. The odd-phase signal (odd) and even-phase signal (even) that are output from the multiplexers 20o and 20e, respectively, are fed to a fine delay circuit 30, which is composed by an interpolating circuit. A phase detector 50 detects the phase difference between the output signal of the fine delay circuit (interpolating circuit) 30 and reference clock signal to deliver its output (UP/DN) to a counter 40. The multiplexers 20o and 20e select even- and odd-numbered taps of the delay circuit 10 based upon the output of the counter 40. Further, on the basis of the output from counter 40, the fine delay circuit (interpolating circuit) 30 changes the ratio of the interior division of the phase difference between the input signals.

A DLL is better suited to the low power consumption than a PLL (phase-locked loop) having a voltage-controlled oscillator because the DLL ceases operating and does not produce an output clock signal when a reference clock signal is not being applied thereto.

FIG. 12 is a diagram illustrating the structure of an interpolating circuit illustrated in the specification of Japanese Patent Kokai Publication JP-A-2001-56723. This specification discloses the interpolator circuit of a DLL used in a DDR (Double Data Rate)—SDRAM (Synchronous DRAM).

As shown in FIG. 12, the interpolating circuit receives internal clocks ACLK, BCLK (or /ACLK, /BCLK) and counter signals CNT3 to CNT0 and outputs an internal clock signal ABCLK (or /ABCLK) having a phase between the internal clocks ACLK, BCLK (or /ACLK, /BCLK). A buffer circuit adjusts the waveform of the internal clock signal ABCLK (or /ABCLK) output from the interpolating circuit and outputs an internal clock signal CLK1 (or /CLK1). The interpolating circuit includes switch circuits 74a, 74b, 74c, and 74d that receive the internal clock signal ACLK, switch circuits 76a, 76b, 76c, and 76d that receive the internal clock signal BCLK, four inverters 78 and resistors R2 and R3. A clocked inverter constitutes each switch and an inverter connected to a pMOS transistor of this clocked inverter. The counter signals CNT0 to CNT3 are supplied to control terminals of the switch circuits 74a, 74b, 74c, and 74d, respectively, via the inverters 78. The numerals shown in the clocked inverters of the switch circuits represent the ratios of the gate widths of the clocked inverters, and the ON resistance of each of the clocked inverters of switches 74a, 74b, 74c, and 74d is one-half of that of the preceding clocked inverter. These form variable resistors in which resistance is varied in conformity with the weighting of the counter signals CNT0 to CNT3. The internal clock signal ABCLK whose phase has a transition edge between the transition edge of the internal clock signal ACLK and the transition edge of the internal clock signal BCLK is formed between the resistors R2 and R3. The buffer circuit includes resistors R4 and R5 connected serially between power supplies VDD and VSS, a differential amplifier 80a that receives the divided potential of resistors R4 and R5, and the internal clock signal BCLK, and an inverter 80b that receives the output of the differential amplifier 80a and outputs the internal clock CLK1. The internal clock signal ABCLK having a phase conforming to the weighting of the counter signals CNT0 to CNT3. An arrangement of the kind shown in FIG. 14 is disclosed in the specification of Japanese Patent Kokai Publication JP-A-2001-56723 as another interpolating circuit.

As shown in FIG. 14, the interpolating circuit includes two sets of a constant-current source 168a, four P-channel MOS transistors 168b, 168c, 168d, and 168e of different gate widths for pulling current supplied by the constant-current source 168a and four N-channel MOS transistors 168f connected serially to the sources of respective ones of the P-channel MOS transistors, and two differential amplifier circuits 168g, and 168h whose outputs are connected to each other. The voltages at nodes v1 and v2 vary in accordance with the weighting of the counter signals CNT0 to CNT3, thereby changing the amplifying capability of the differential amplifier circuits 168g and 168h, as a result of which the internal clock signal CLK1 (or /CLK1) having a phase between the internal clocks ACLK and BCLK (or /ACLK and /BCLK) is produced as an output.

In the specification Japanese Patent Kokai Publication JP-A-2001-56723, the clock signals ACLK, /ACLK, BCLK, /BCLK supplied to the interpolating circuit shown in FIG. 12 are selected in switch circuits by shift registers 1060 and 1064 in the manner shown in FIG. 15. FIG. 15 is a diagram illustrating the structure of a clock delay generator that generates the clock signals ACLK and BCLK. The clock delay generator includes a delay circuit 1054, a delay-stage activating circuit 1056, a first switch circuit 1058, a first shift register 1060, a second switch circuit 1062 and a second shift register 1064.

In a case where a circuit for generating a tap control signal, which selects the switch that selects the tap of the delay circuit, is constituted by a shift register, the cycle necessary for locking lengthens, as will be described in detail later.

With a DDR (Double Date Rate)-II (the high-speed specification of a DDT SDRAM) having twice the operating frequency, it is necessary to raise the output timing precision. A high speed of 200 to 300 MHz (400 to 600 Mbps) is obtained with a DDR-II-SDRAM.

In a shift register for generating a tap control signal that selects the tap of the delay circuit, the step of setting a rough (coarse adjustment) initial value is at most a single stage of delay elements (delay elements 101, etc., in FIG. 3.).

In order to shorten lock time, it is required that the initial value of the tap (delay line) of the delay circuit be set to a median. However, locking will not necessarily be achieved in the shortest cycle. That is, the time it takes for the signal to propagate through the delay line becomes unnecessarily long and, hence, a variation in output timing increases proportionally and so does power consumption.

For example, in an arrangement for carrying out control for selection of a delay-circuit tap by a shift register, assume that the number of delay elements (D01, D02, etc., in FIG. 15) is 128, that the initial value of the shift register is the center tap, and that the lock point is at the initial stage or final stage (128th stage). In order to select a tap corresponding to the lock point in such case, a phase comparison must be performed 64 times and a cycle for phase adjustment in the interpolating circuit is required as well.

In order to satisfy the specification regarding the number of clock cycles and the minimum operating frequency, the number of delay-element stages cannot be increased and the propagation time per delay element, namely the interval between two signals interpolated (the phase difference of the two signals input to the interpolating circuit) cannot be shortened.

Furthermore, since control is performed by shorting the outputs of the inverters having different current drive capabilities in the interpolating circuit shown in FIG. 12, the range of linear operation is narrow. As a consequence, precision is not improved even if the setting resolution is raised.

In the circuit shown in FIG. 14, on the other hand, signals of opposite phase, namely the internal clock signals ACLK and /ACLK, are supplied to the differential amplifier circuits. It is necessary that these signals of opposite phase be supplied to the differential amplifier circuits at the same timing. In a case where the internal clock signal /ACLK is generated by inverting the signal ACLK in an inverter, interpolation is not performed correctly owing to the propagation delay time of the inverter.

As a delay element composing a delay circuit, a pair of delay circuits for delaying signals of mutually opposite phase is required, as a result of which area and operating current are doubled. This is also a source of error.

Further, in a case where the delay elements of the delay circuit are constituted by a differential amplifier circuit, standby current increases.

SUMMARY OF THE DISCLOSURE

Accordingly, it is an object of the present invention to provide an interpolating circuit, a DLL and a semiconductor integrated circuit for implementing high-precision interpolation while reducing the scale of the circuitry and operating current.

The above and other objects of the invention are attained by an interpolating circuit, in accordance with one aspect of the present invention, which receives first and second signals, for generating an output signal having a phase corresponding to a value obtained by dividing a phase difference between the first and second signals in accordance with a preset interior division ratio, comprising: a waveform synthesis unit that includes a first switch element inserted between a node, which is connected to an output terminal from which the output signal is delivered, and a first power supply; means for placing the first switch element in an ON state when the first and second signals are both a first logic value; a first series circuit composed by serial connection of a first constant-current source and a second switch element placed in the ON state when the first signal is a second logic value; and a second series circuit composed by serial connection of a second constant-current source and a third switch element placed in the ON state when the second signal is the second logic value; the first series circuit and the second series circuit being connected in parallel with each other between the node connected to the output terminal and a second power supply; and a bias control unit for setting values of current that flow through the first and second current sources of the waveform synthesis unit to values conforming to the interior division ratio.

In the interpolating circuit according to the present invention, the bias control unit has a plurality of circuits each comprising a constant-current source and a pair of switch elements composed of a switch element having one end connected to the constant-current source and a control terminal to which a control signal is input to turn this switch element on and off, and a switch element having one end connected to the constant-current source and a control terminal to which an inverted signal of the control signal is input to turn this switch element on and off; and means for performing control in such a manner that a total of currents that flow into a group of switch elements to the control terminals of which the control signal is input from among the pairs of switch elements in the plurality of circuits is made a first current value and so that a current value equal to the first current value will flow into the first current source, and in such a manner that the total of currents that flow into a group of switch elements to the control terminals of which the inverted signal of control signal is input among the pairs of switch elements in the plurality of circuits is made a second current value and so that a current value equal to the second current value will flow into the second current source.

In accordance with another aspect of the present invention, there is provided an interpolating circuit, which receives first and second signals from first and second input terminals, respectively, for generating, and delivering from an output terminal, an output signal having a phase corresponding to a value obtained by dividing a phase difference between the first and second signals in accordance with a division ratio set by a control signal that enters from a control signal input terminal, comprising: a waveform synthesis unit that includes a logic circuit, to which the first and second signals are input, for outputting the result of a predetermined logic operation applied to the first and second signals; a first transistor, which is inserted between a node connected to the output terminal and a first power supply, having a control terminal to which an output signal from the logic circuit is input to turn the first transistor on and off; a first series circuit composed by serial connection of a first current source transistor and a second transistor having a control terminal to which the first signal is input to turn the second transistor on and off; a second series circuit composed by serial connection of a second current source transistor and a third transistor having a control terminal to which the second signal is input to turn the third transistor on and off; the first series circuit and the second series circuit being connected in parallel with each other between the node and a second power supply; and a bias control unit for performing control, based upon a control signal that decides the interior division ratio, in such a manner that current values conforming to the interior division ratio will flow into respective ones of the first and second current sources of the waveform synthesis unit; the bias control unit having a plurality of circuits each comprising a constant-current source transistor connected to the first power supply, a first switch transistor, which is inserted between the constant-current source transistor and a first node connected to the control terminal of the first constant-current source transistor, having a control terminal to which the control signal that decides the interior division ratio is input to turn the first switch transistor on and off, and a second switch transistor, which is inserted between the constant-current source transistor and a second node connected to the control terminal of the second constant-current source transistor, having a control terminal to which an inverted signal of the control signal that decides the interior division ratio is input to turn the second switch transistor on and off; wherein connection points between the group of first switch transistors and first nodes of the plurality of circuits are connected to a diode-connected fourth transistor, a control terminal of the diode-connected fourth transistor is connected in common with the control terminal of the first constant-current source transistor, connection points between the group of second switch transistors and second nodes of the plurality of circuits are connected to a diode-connected fifth transistor, and a control terminal of the diode-connected fifth transistor is connected in common with the control terminal of the second constant-current source transistor.

In accordance with another aspect of the present invention, the foregoing object is attained by providing a DLL circuit comprising: a delay circuit, to which an input reference signal is applied, for delaying the reference signal and outputting signals having different delay times from respective ones of a plurality of taps; first and second multiplexers for selecting and outputting signals from even-numbered taps and odd-numbered taps, respectively, of the delay circuit; a fine delay circuit, to which outputs from the first and second multiplexers are input as first and second signals, respectively, for outputting a signal of a finely adjusted delay time; a phase detector, to which the output of the fine delay circuit and the reference signal are input, for detecting a phase difference between these two signals; and a counter in which the count is varied based upon an output from the phase detector; the first and second multiplexers selecting even-numbered taps and odd-numbered taps, respectively, of the delay circuit based upon an output from the counter. The fine delay circuit comprises the above-described interpolating circuit according to the present invention.

In accordance with a further aspect of the present invention, there is provided a DLL circuit comprising: an input buffer circuit to which an input signal is applied; a delay circuit, to which an output signal from the input buffer circuit is input, for delaying the signal and outputting signals having different delay times from respective ones of a plurality of taps; first and second multiplexers for selecting and outputting signals from even-numbered taps and odd-numbered taps, respectively, of the delay circuit; a fine delay circuit, to which outputs from the first and second multiplexers are input as first and second signals, respectively, for outputting a signal of a finely adjusted delay time; a third multiplexer for selectively outputting input data using the output of the fine delay circuit as a changeover signal; an output buffer to which an output of the third multiplexer is input for being output as output data; a fourth multiplexer, to which the output of the fine delay circuit is input, having a delay time equivalent to that of the third multiplexer; a first buffer circuit, to which an output of the fourth multiplexer is input, having a dummy delay time equivalent to delay time of the output buffer; a second buffer circuit, to which an output of the first buffer is input, having a dummy delay time equivalent to delay time of the input buffer; a phase detector, to which the output signal of the second buffer circuit and the input signal are input, for detecting a phase difference between these two signals; and a counter in which the count is varied based upon an output from the phase detector; the first and second multiplexers selecting even-numbered taps and odd-numbered taps, respectively, of the delay circuit based upon an output from the counter. The fine delay circuit comprises the above-described interpolating circuit according to the present invention.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of practicing the present invention will be described with reference to the drawings.

Figure 1:
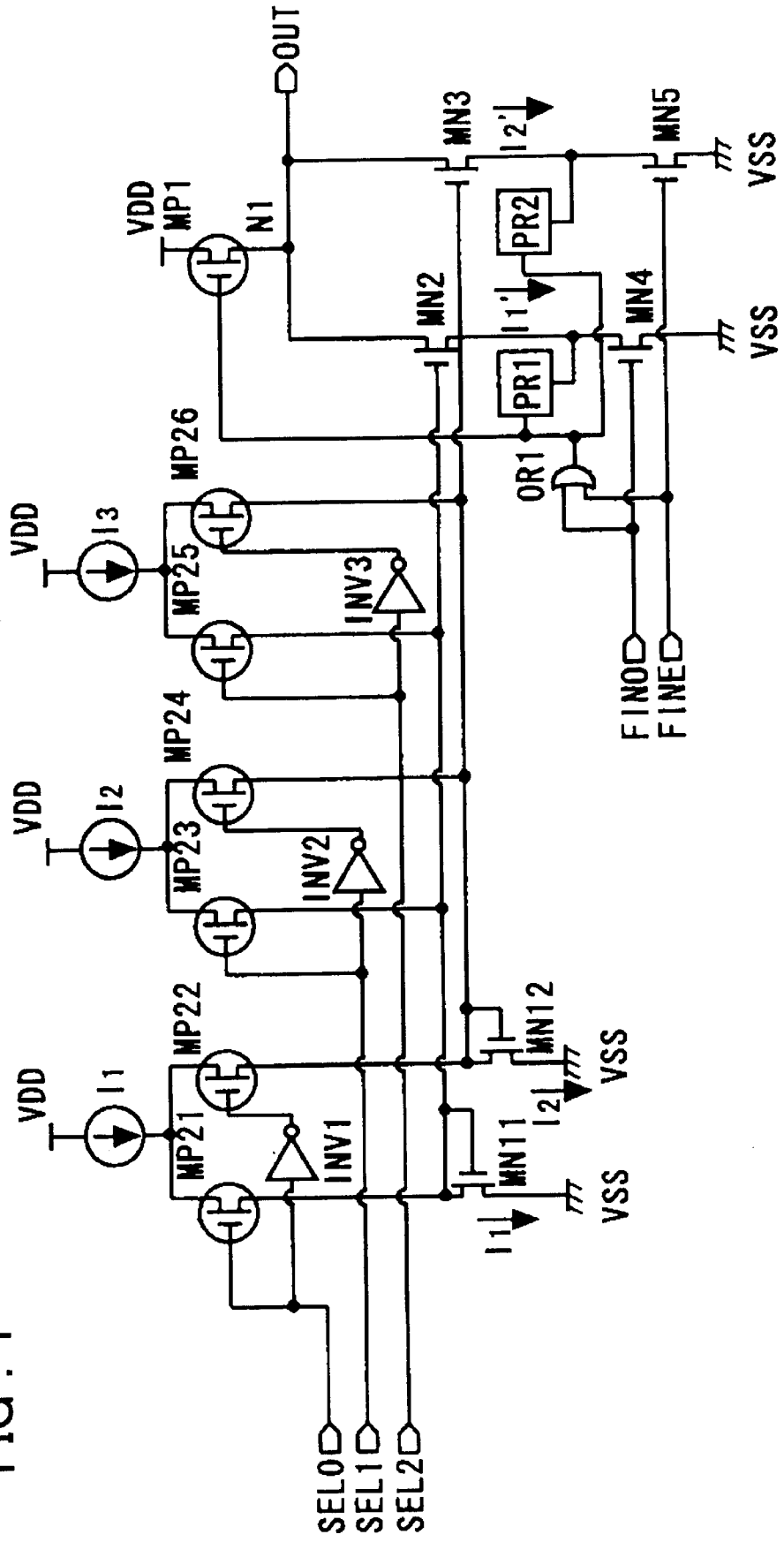
FIG. 1 is a diagram illustrating the structure of a first embodiment of the present invention.

In one preferred embodiment of the present invention, as shown in FIG. 1, an interpolating circuit for producing an output signal having a phase decided by a value obtained by performing interior division of a phase difference between first and second signals (FINO and FINE) input thereto in accordance with a set interior division ratio includes a waveform synthesis unit (1) having a first switch element (MP1) inserted into a charging path of a node (N1) connected to an output terminal (OUT), means for charging the node (N1) by turning on the first switch element (MP1) when the first signal (FINO) and second signal (FINE) are both a first logic value, and first and second discharge paths provided to correspond to the first signal (FINO) and second signal (FINE) and connected to the node (N1). A first current source (MN2) and a second switch element (MN4) that is turned on and off based upon the first signal (FINO) are serially inserted into the first discharge path, and a second current source (MN3) and a third switch element (MN5) that is turned on and off based upon the second signal (FINE) are serially inserted into the second discharge path. At least one of the second switch element (MN4) and third switch element (MN5) is turned on to discharge the node (N1), which is connected to the output terminal, when at least one of the first signal (FINO) and second signal (FINE) is a second logic value. More specifically, the waveform synthesis unit (1) comprises: a logic circuit (OR1), which receives the first and second signals (FINO and FINE), for outputting the logic OR of these two signals; the first switch (MP1) inserted between the node (N1), which is connected to the output terminal (OUT), and a first power supply (VDD) and having a control terminal to which an output signal of the logic circuit (OR1) is input to turn the first switch (MP1) on and off; a first series circuit comprising the first constant-current source (MN2) and the second switch element (MN4), which has a control terminal to which the first signal (FINO) is input to turn the second switch element (MN4) on and off; and a second series circuit comprising the second constant-current source (MN3) and the third switch element (MN5), which has a control terminal to which the second signal (FINE) is input to turn the third switch element (MN5) on and off; the first and second series circuit being connected in parallel between the first node (N1) and a second power supply (VSS).

A bias control unit (2), which is for controlling the bias of the first constant-current source (MN2) and second constant-current source (MN3) of the waveform synthesis unit (1), generates a first current (I1) and a second current (I2), the current-value ratio of which conforms to the interior division ratio, in response to two sets of current-path switches (MP21, MP23, MP25 and MP22, MP24, MP26) being turned on and off based upon control signals (SEL0, SEL1, SEL2), which decide the interior division ratio, by these control signals and inverted signals thereof, and performs control in such a manner that currents corresponding to current values of respective ones of the first current (I1) and second current (I2) flow into the first constant-current source (MN2) and second constant-current source (MN3).

In the embodiment of the present invention, the interpolating circuit further comprises a first precharge circuit (PR1) for pre-discharging or precharging a connection node between the first constant-current source (MN2) and second switch element (MN4), and a second precharge circuit (PR2) for pre-discharging or precharging a connection node between the second constant-current source (MN3) and third switch element (MN5). The first precharge circuit (PR1) comprises a fourth switch element (MP2), which is inserted between the first power supply (VDD) and a connection node between the first constant-current source (MN2) and second switch element (MN4), having a control terminal to which the output signal of the logic circuit (OR1) is supplied to turn the fourth switch element (MP2) on and off. The second precharge circuit (PR2) comprises a fifth switch element (MP3), which is inserted between the first power supply (VDD) and a connection node between the second constant-current source (MN3) and third switch element (MN5), having a control terminal to which the output signal of the logic circuit (OR1) is supplied to turn the fifth switch element (MP3) on and off.

In the embodiment of the present invention, the bias control unit (2) includes a plurality of circuits each comprising a constant-current source (Ij, where j=1, 2, and 3), and a pair of switches that includes a switch element (MP21+2(j−1), where j=1, 2, and 3), which has one end connected in common with the constant-current source (Ij) as well as a control terminal to which a control signal (SELj−1, where j=1, 2, and 3) that decides the interior division ratio is supplied to turn this switch element on and off, and a switch element (MP22+2(j−1), where j=1, 2, and 3), which has one end connected in common with the constant-current source (Ij) and has a control terminal to which an inverted signal of the control signal is input to turn this switch element on and off. The bias control unit (2) performs control in such a manner that a current (first current value I1), which is equal to the total of currents that flow into a switch element group (MP21, MP23, and MP25) to the control terminals whereof the control signals (SEL0, SEL1, and SEL2) are input, will flow into the first constant-current source (MN2), and such that a current (second current value I2), which is equal to the total of currents that flow into a switch element group (MP22, MP24, and MP26) to the control terminals whereof inverted signals obtained by inverting the control signals (SEL0, SEL1, and SEL2) by inverters (INV1, INV2, and INV3) are input, will flow into the second constant-current source (MN3).

More specifically, the current value I1, which is the total of the currents that flow into the group of first switch elements (MP21, MP23, and MP25) having the control signals (SEL0, SEL1, and SEL2) input to their control terminals, flows into a diode-connected first transistor (MN11), and the first transistor (MN11) has a control terminal that is connected to the control terminal of the transistor (MN2) constituting the first current source. The current value I2, which is the total of the currents that flow into the group of second switch elements (MP22, MP24, and MP26) having the inverted signals obtained by inverting the control signals (SEL0, SEL1, and SEL2) by the inverters (INV1, INV2, and INV3) input to their control terminals, flows into a diode-connected second transistor (MN12), and the second transistor (MN12) has a control terminal that is connected to the control terminal of the transistor (MN3) constituting the second current source.

The current values of the constant-current sources (I1, I2, and I3) of the bias control unit are weighted as follows: 1:2:4, etc. For example, the ratio between the first and second current values is set as follows depending upon the values of the control signals (SEL0, SEL1, SEL2): 0:7, 1:6, 2:5, 3:4, 4:3, 5:2, 6:1, 7:0.

Figure 3:
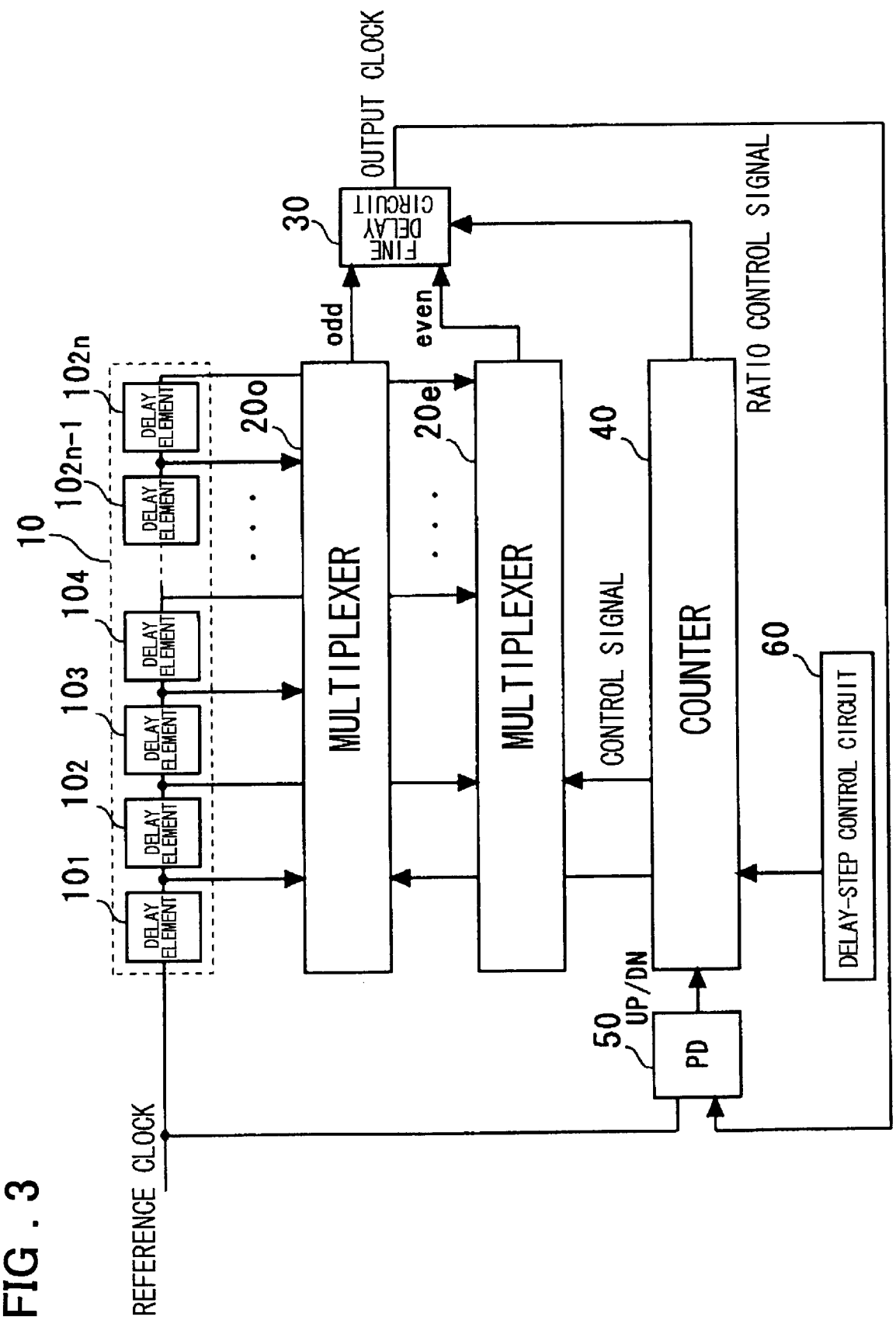
FIG. 3 is a diagram illustrating the structure of a third embodiment of the present invention.

In a preferred mode of carrying out the present invention, as shown in FIG. 3, a DLL circuit comprises a delay circuit (10), to which an input signal is applied, for delaying the signal and outputting signals having different delay times from respective ones of a plurality of taps; multiplexers (20o and 20e) for selecting and outputting signals from even- and odd-numbered taps, respectively, of the delay circuit; a fine delay circuit (30), to which outputs from the first and second multiplexers (20o and 20e) are input as first and second signals, respectively, for finely adjusting delay time; a phase detector (50), to which the output signal of the fine delay circuit and the input signal are input, for detecting phase lag/lead; and a counter (40) for counting up/down based upon an output from the phase detector (50); the fine adjustment circuit (30) of the DLL circuit, in which the multiplexers select even- and odd-numbered taps, respectively, of the delay circuit based upon an output from the counter (4), being constituted by the above-described interpolating circuit. In the multiplexers (20o and 20e) for selecting signals of odd and even phases from the delay circuit (10) based upon an output from the counter (40), a tap changeover signal for selecting a tap is made a Grey code and only one bit makes a transition at a time, as a result of which hazard occurrence is avoided. A control signal for internally dividing the phase difference between the two signals input to the fine adjustment circuit (30) also is supplied from the counter (40). Means (60) is provided for varying the steps by which the counter (40) counts up and down.

Figure 4:
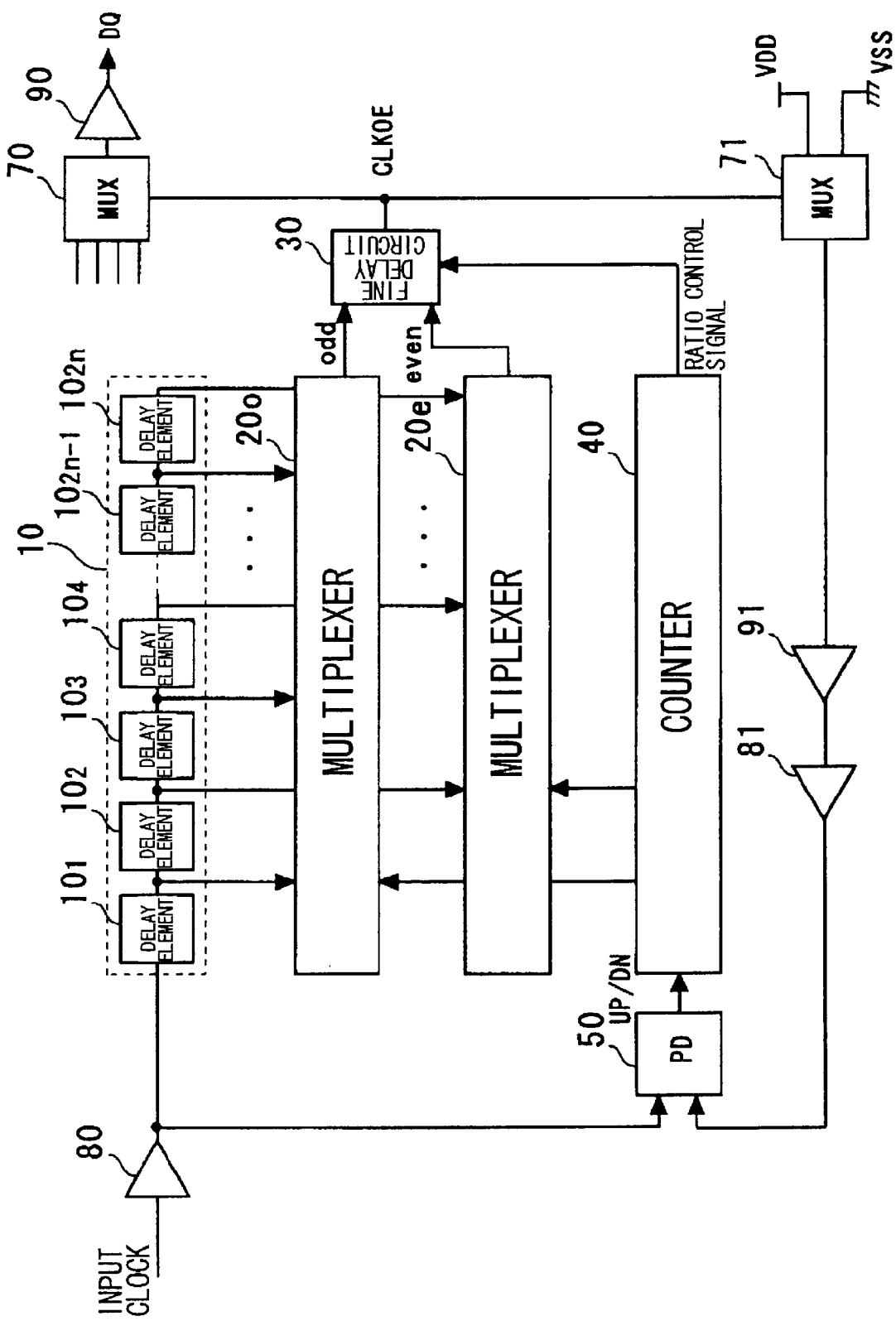
FIG. 4 is a diagram illustrating the structure of a fourth embodiment of the present invention.

In a preferred mode of carrying out the present invention, as shown in FIG. 4, a DLL circuit comprises an input buffer (80) to which an input signal is applied; a delay circuit (10), to which an output signal from the input buffer (80) is input, for delaying the signal and outputting signals having different delay times from respective ones of a plurality of taps; first and second multiplexers (20o and 20e) for selecting one odd-numbered tap and one even-numbered tap, respectively, of the delay circuit (10) and outputting a signal of an odd phase and a signal of an even phase, respectively; a fine delay circuit (30), to which the signal of an odd phase and a signal of an even phase output from the first and second multiplexers (20o and 20e), respectively, are input as first and second signals, respectively, for outputting a signal of a finely adjusted delay time; a third multiplexer (70) for selectively outputting input data using the output of the fine delay circuit (30) as a changeover signal; an output buffer (90) to which an output of the third multiplexer (70) is input for being output as output data; a fourth multiplexer (71), to which the output of the fine delay circuit (30) is input, having a delay time equivalent to that of the third multiplexer; a first buffer (91), to which an output of the fourth multiplexer (71) is input, having a dummy delay time equivalent to delay time of the output buffer (90); a second buffer (81), to which an output of the first buffer is input, having a dummy delay time equivalent to delay time of the input buffer (80); a phase detector (50), to which the output signal of the second buffer (81) and the output signal of the input buffer (80) are input, for detecting a phase difference between these two signals; and a counter (40) in which the count is varied based upon an output from the phase detector (50); the first and second multiplexers (20o and 20e) for selecting even- and odd-numbered taps, respectively, of the delay circuit (10) based upon an output from the counter (40). The fine delay circuit (30) comprises the above-described interpolating circuit according to the present invention.

In a preferred mode of practicing the present invention, the DLL circuit is such that the code of the control signal that is input to the first and second multiplexers (20o and 20e) from the counter (40) to change over the tap of the delay circuit (10) comprises a Grey code. The counter (40) outputs the Grey code as its count.

Figure 6:
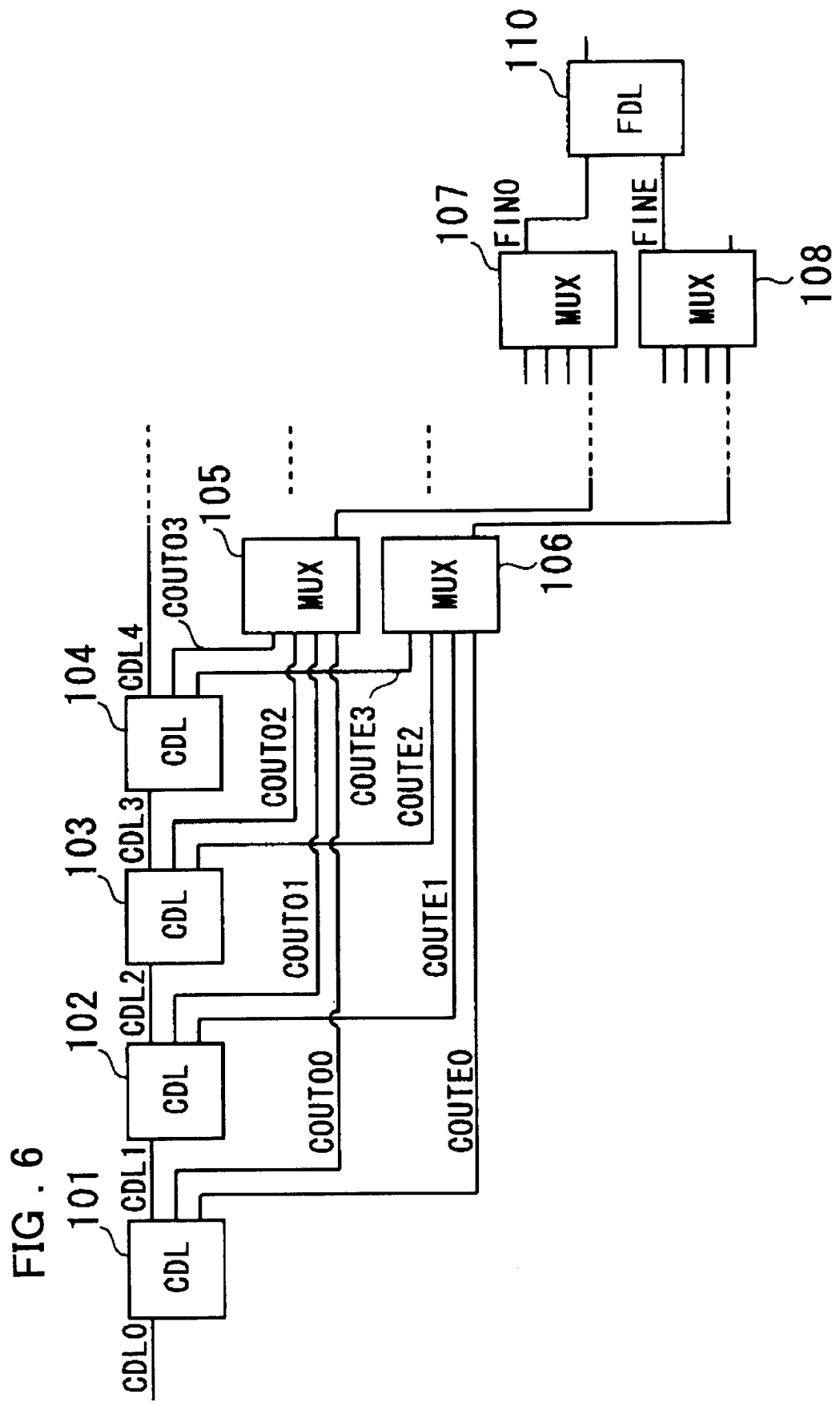
FIG. 6 is a block diagram showing the connections among coarse-adjustment delay circuits (CDL), multiplexers (MUX) and a fine delay circuit according to an embodiment of the present invention.

In a preferred mode of practicing the present invention, as shown in FIG. 6, the DLL circuit is such that the delay circuit (10) comprises coarse-adjustment delay circuits, and the first and second multiplexers (20o and 20e) for selecting the odd- and even-numbered taps include a first stage of a plurality of multiplexers (105 and 106) that select one of a predetermined number of signals of a plurality of successive taps, and a second stage of multiplexers (107 and 108) that select one output of the plurality of multiplexers of the first stage; wherein signals of odd and even phases output from the multiplexers of the second stage are input to an interpolating circuit for fine adjustment.

The interpolating circuit according to the present invention and the DLL circuit having this interpolating circuit excel in linearity implement highly precise interpolation and reduce power consumption. They are ideal for application to a semiconductor memory device such as a DDR-SDRAM and to a clock-synchronized semiconductor integrated circuit device.

Embodiments of the present invention will now be described in greater detail with reference to the drawings.

FIG. 1 is a diagram illustrating the structure of an interpolating circuit according to an embodiment of the present invention.

Referring to FIG. 1, the interpolating circuit according to this embodiment comprises a waveform synthesis unit 1 and a bias control unit 2. In this interpolating circuit for producing an output signal having a phase decided by a value obtained by performing interior division of a phase difference between first and second signals FINO and FINE input thereto in accordance with a set interior division ratio, the waveform synthesis unit 1 includes a logic OR gate OR1, to which the first and second signals FINO and FINE are input, for outputting the logic OR between these two signals; and a P-channel MOS transistor MP1 inserted between a node N1, which is connected to an output terminal OUT, and a power supply VDD and having a gate terminal to which an output signal of the OR gate OR1 is input to turn the P-channel MOS transistor MP1 on and off. The waveform synthesis unit 1 further includes a first series circuit composed by serial connection of an N-channel MOS transistor MN2 constituting a first constant-current source and an N-channel MOS transistor MN4, which has a gate terminal to which the first signal FINO is input to turn the N-channel MOS transistor MN4 on and off; and a second series circuit composed by serial connection of an N-channel MOS transistor MN3 constituting a second constant-current source and an N-channel MOS transistor MN5, which has a gate terminal to which the second signal FINO is input to turn the N-channel MOS transistor MN5 on and off. The first and second series circuits are connected in parallel between the node N1 a power supply VSS.

The bias control unit 2 performs control based upon control signals (SEL0 to SEL2), which decide the interior division ratio, in such a manner that current values corresponding to the interior division ratio flow into respective ones of the first and second constant-current source transistors MN2 and MN3 of the waveform synthesis unit 1.

There are provided a first precharge circuit PR1 for pre-discharging or precharging a connection node between the N-channel MOS transistor MN2 and N-channel MOS transistor MN4, and a second precharge circuit PR2 for pre-discharging or precharging a connection node between the N-channel MOS transistor MN3 and N-channel MOS transistor MN5.

The bias control unit 2 includes a plurality of circuits each comprising a constant-current source Ij (where j=1, 2, and 3) having one end connected to the power supply VDD, and a pair of transistors that includes a P-channel MOS transistor MP21+2(j−1) which has a source terminal connected in common with the other end of the constant-current source Ij as well as a gate terminal to which a control signal SELj−1 (where j=1, 2, 3) that decides the interior division ratio is input to turn this transistor on and off, and a P-channel MOS transistor MP22+2(j−1) which has a gate terminal to which a signal obtained by inverting the control signal SELj−1 (where j=1, 2, and 3) by an inverter INVj is input to turn this transistor on and off.

More specifically, the drain terminals of the P-channel MOS transistors MP21, MP23 and MP25 having the control signals SEL0, SEL1 and SEL2, respectively, input to their gate terminals are connected in common and to the drain terminal of an N-channel MOS transistor MN11. The gate terminal of the N-channel MOS transistor MN11 is connected to its drain terminal (the transistor MN11 is diode-connected) and to the gate terminal of the N-channel MOS transistor MN2. The source terminal of the N-channel MOS transistor MN11 is connected to the power supply VSS. The N-channel MOS transistor MN11 performs control in such a manner that a current equal to the total of the currents that flow into the P-channel MOS transistors MP21, MP23 and MP25 will flow into the first constant-current source transistor MN2.

The drain terminals of the P-channel MOS transistors MP22, MP24 and MP26 having the signals obtained by inverting the control signals SEL0, SEL1 and SEL2 by inverters INV1, INV2 and INV3, respectively, applied to their gate terminals are connected in common and to the drain terminal of an N-channel MOS transistor MN12. The gate terminal of the N-channel MOS transistor MN12 is connected to its drain terminal (the transistor MN12 is diode-connected) and to the gate terminal of the N-channel MOS transistor MN3. The source terminal of the N-channel MOS transistor MN11 is connected to the power supply VSS. The N-channel MOS transistor MN12 performs control in such a manner that a current equal to the total of the currents that flow into the P-channel MOS transistors MP22, MP24 and MP26 will flow into the second constant-current source transistor MN3.

The principle of operation of the interpolating circuit according to the embodiment of the invention shown in FIG. 1 will now be described. When the two input signals FINO and FINE supplied to the waveform synthesis unit 1 are at LOW level, the P-channel MOS transistor MP1 conducts (turns on) so that the node N1 is charged to the power-supply voltage VDD. Electric charge Q that accumulated at the node N1 is given by $$Q = C \times VDD$$

where C represents the capacitance at the node N1. At this time the potential at node N1 is at HIGH level. Further, the connection node between the N-channel MOS transistors MN2 and MN4 and the connection node between the N-channel MOS transistors MN3 and MN5 are precharged by the first and second precharge circuits PR1 and PR2, respectively.

If the potential at node N1 changes under these conditions and falls below a logic threshold voltage VT and the voltage deviation that prevails until the LOW level is attained is represented by V (=VDD−VT), then the amount of electric charge to be discharged by the time the node N1 falls from HIGH level to LOW level is C×V.

Let T represent the phase difference between the rising edges of the odd-phase signal FINO and even-phase signal FINE.

When the signal FINO rises from LOW to HIGH level, the output of the OR gate OR1 attains HIGH level, the P-channel MOS transistor MP1 is rendered non-conductive, transistor MN4 is rendered conductive and the charge at node N1 is discharged over time T by a current I1' of the constant-current source transistor MN2. The charge that is discharged during this time is $$I1' \times T$$

and residual charge Q' at node N1 is $$Q' = C \times VDD - I1' \times T$$

Next, when the signal FINE rises from the low to HIGH level, the output of OR gate OR1 is held at HIGH level, transistor MN5 conducts and the charge Q' at node N1 is discharged by the sum of the current I1' of constant-current source transistor MN2 and the current I2' of constant-current source transistor MN3.

When the potential V at node N1 falls below the logic threshold voltage VT, it changes to LOW level and the output terminal OUT delivers the NOR between the signals FINO and FINE.

As a result, if the phase difference PH between the rising edge of the input signal FINO and the falling edge of the output signal at the output terminal OUT is expressed in terms of time, we have $$PH = T + (C \times V - I1' \times T)/(I1' + I2')$$
$$= C \times V /(I1' + I2') + T \times [1 - I1'/(I1' + I2')]$$
$$= C \times V /(I1' + I2') + T \times I1'/(I1' + I2')$$

Here C×V(I1'+I2') represents the phase difference between the input and output signals when the input signals FINO and FINE rise simultaneously. Since I1'+I2' is a constant value, C×V(I1'+I2') in the above equation is a constant term.

If I1':I2'=(1−x):x holds, then T×I2'/(I1'+I2') becomes a value xT obtained by interior division of the phase different T between the signals FINO and FINE in accordance with an interior division ratio (1−x):x.

The ratio of I1' to I2' is decided by the values of the control signals SEL0, SEL1, SEL2 input to the bias control unit 2.

The current values of the current sources I1, I2 and I3 are weighted in the manner 1:2:4, by way of example. The ratio among the current driving capabilities of the P-channel MOS transistors MP21 and MP22, the current driving capabilities of the P-channel MOS transistors MP22 and MP24 and the current driving capabilities of the P-channel MOS transistors MP25 and MP26 is set at 1:2:4.

When (SEL0, SEL1, SEL2)=(L,L,L) holds, for example, the P-channel MOS transistors MP21, MP23 and MP25 turn on, the P-channel MOS transistors MP22, MP24 and MP26 turn off, the current I1 that flows into the transistor MN11 becomes $$I1=(1+2+4)I0=7I0$$

and the current I2 that flows into the transistor MN12 becomes $$I2=0.$$

When (SEL0, SEL1, SEL2)=(H,L,L) holds, the P-channel MOS transistors MP22, MP23, MP25 turn on, the P-channel MOS transistors MP21, MP24, MP26 turn off, and we have $$I1=(2+4)I0=6I0, I2=I0$$

When (SEL0, SEL1, SEL2)=(H,H,L) holds, the P-channel MOS transistors MP22, MP24, MP25 turn on, the P-channel MOS transistors MP21, MP23, MP26 turn off, and we have $$I1=4I0, I2=(1+2)I0=3I0$$

Operation is performed similarly with regard to other combinations as well. In accordance with the 3-bit control signal (SEL0, SEL1, and SEL2), currents I1 and I2 corresponding to the ratios 0:7, 1:6, 2:5, 3:4, 4:3, 5:2, 6:1, 7:0 flow into the diode-connected N-channel MOS transistors MN11 and MN12, the gates of the diode-connected N-channel MOS transistors MN11 and MN12 are connected to the gates of the N-channel MOS transistors MN2 and MN3, respectively, and the currents I1', I2' corresponding to the current values I1 and I2 flow into the N-channel MOS transistors MN2 and MN3.

As a result, the output terminal OUT delivers an output signal having a phase decided by a value obtained by internally dividing the phase difference between the signals FINO and FINE of mutually different phase, which are input to the waveform synthesis unit 1, at a ratio conforming to the 3-bit control signal (SEL0, SEL1, and SEL2). It should be noted that the output terminal OUT might of course be provided with a waveshaping inverter, a voltage follower or a non-inverting buffer composed of two inverter stages.

A second embodiment of the present invention will be described next.

Figure 2:
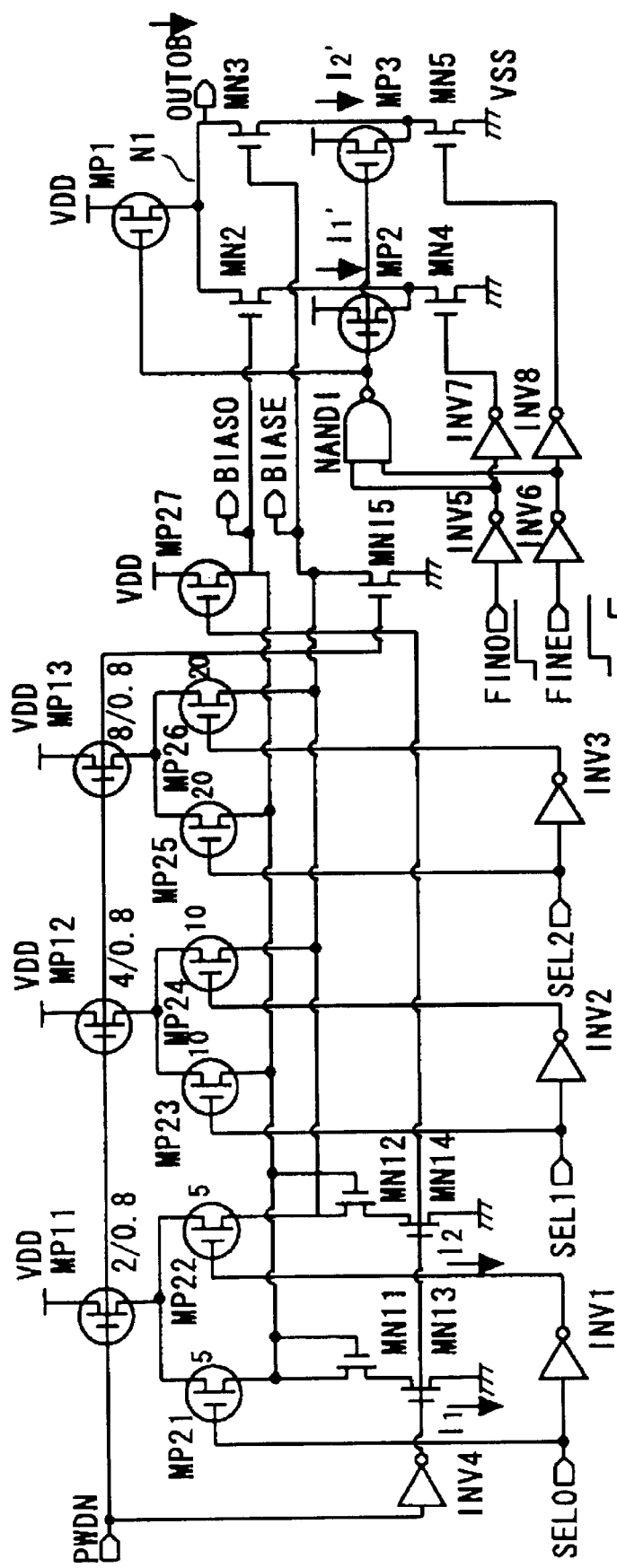
FIG. 2 is a diagram illustrating the structure of a second embodiment of the present invention.

FIG. 2 is a diagram illustrating the structure of a second embodiment of the invention. This shows an interpolating-circuit arrangement contrived to perform power-down control and reduce power consumption. In this embodiment, a standby control function is added to the arrangement of FIG. 1, the bias control unit 2 ceases operating (no consumed current flows) when a power-down control signal PWDN is at HIGH level, and is activated when the power-down control signal PWDN is at LOW level.

As shown in FIG. 2, the waveform synthesis unit 1 includes inverters INV5 and INV6 for inverting and outputting the first and second signals FINO and FINE, respectively; inverters INV7 and INV8 for inverting and outputting the output signals of the inverters INV5 and INV6, a NAND gate NAND1, which receives the output signals of the inverters INV5 and INV6 for outputting the result of a NAND operation applied to these signals; and the P-channel MOS transistor MP1 inserted between the node N1, which is connected to the output terminal OUT, and the power supply VDD, turned on and off by the output of the NAND gate NAND1 input to its gate terminal.

The waveform synthesis unit 1 further includes the N-channel MOS transistor MN2 composing a first constant-current source and having its drain terminal connected to the node N1; the N-channel MOS transistor MN4 having its drain terminal connected to the source terminal of the N-channel MOS transistor MN2 and its source terminal connected to the power supply VSS, and having the output signal of the inverter INV7 input to its gate terminal to turn this transistor on and off; the N-channel MOS transistor MN3 composing a second constant-current source and having its drain terminal connected to the node N1; and the N-channel MOS transistor MN5 having its drain terminal connected to the source terminal of the N-channel MOS transistor MN3 and its source terminal connected to the power supply VSS, and having the output signal of the inverter INV8 input to its gate terminal to turn this transistor on and off.

Further a P-channel MOS transistor MP2 composes a first precharge circuit, and a P-channel MOS transistor MP3 composes a second precharge circuit. The P-channel MOS transistor MP2 has a source terminal connected to the power supply VDD, a gate terminal connected to the output end of the NAND gate NAND1 and a drain terminal connected to a connection node between the source terminal of the N-channel MOS transistor MN2 and the drain terminal of the N-channel MOS transistor MN4. The P-channel MOS transistor MP3 has a source terminal connected to the power supply VDD, a gate terminal connected to the output end of the NAND gate NAND1 and a drain terminal connected to a connection node between the source terminal of the N-channel MOS transistor MN3 and the drain terminal of the N-channel MOS transistor MN5.

The bias control unit 2 includes P-channel MOS transistors MP11, MP12, MP13 whose source terminals are connected to the power supply VDD and to the gate terminals of which the power-down control signal PWDN is applied.

The bias control unit 2 further includes the P-channel MOS transistor MP21 having its source terminal connected to the drain terminal of the P-channel MOS transistor MP11, and having the control signal SEL 0 that decides the interior division ratio input to its gate terminal to be turned on and off thereby; the P-channel MOS transistor MP22 having its source terminal connected to the drain terminal of the P-channel MOS transistor MP11, and having a signal obtained by inverting the control signal SEL0 by the inverter INV1 input to its gate terminal to be turned on and off thereby; the P-channel MOS transistor MP23 having its source terminal connected to the drain terminal of the P-channel MOS transistor MP12, and having the control signal SEL 1 that decides the interior division ratio input to its gate terminal to be turned on and off thereby; the P-channel MOS transistor MP24 having its source terminal connected to the drain terminal of the P-channel MOS transistor MP12, and having a signal obtained by inverting the control signal SEL1 by the inverter INV2 input to its gate terminal to be turned on and off thereby; the P-channel MOS transistor MP25 having its source terminal connected to the drain terminal of the P-channel MOS transistor MP13, and having the control signal SEL2 that decides the interior division ratio input to its gate terminal to be turned on and off thereby; and the P-channel MOS transistor MP26 having its source terminal connected to the drain terminal of the P-channel MOS transistor MP13, and having a signal obtained by inverting the control signal SEL2 by the inverter INV3 input to its gate terminal to be turned on and off thereby.

The drain terminals of the P-channel MOS transistors MP21, MP23 and MP25 are connected in common and to the drain terminal of the N-channel MOS transistor MN11, and the gate terminal of the N-channel MOS transistor MN11 is connected to its drain terminal and to the gate terminal of the N-channel MOS transistor MN2. In FIG. 2, the node at the point of connection between the drain terminal of the N-channel MOS transistor MN11 and the gate terminal of the N-channel MOS transistor MN2 is represented by a bias node "BIAS0".

The source terminal of the N-channel MOS transistor MN11 is connected to the drain of an N-channel MOS transistor MN13 having a gate terminal to which is input a signal obtained by inverting the power-down control signal PWDN by the inverter INV4. The source terminal of the N-channel MOS transistor MN13 is connected to the power supply VSS. When the power-down control signal PWDN is at LOW level, the N-channel MOS transistor MN13 turns on and the N-channel MOS transistor MN11 performs control in such a manner that a current proportional or equal to the current I1, which is the total of the currents that flow into the P-channel MOS transistors MP21, MP23 and MP25, will flow into the first constant-current source transistor MN2.

The drain terminals of the P-channel MOS transistors MP22, MP24 and MP26 are connected in common and to the drain terminal of the N-channel MOS transistor MN12. The gate terminal of the N-channel MOS transistor MN12 is connected to its drain terminal and to the gate terminal of the N-channel MOS transistor MN3. In FIG. 2, the node at the point of connection between the drain terminal of the N-channel MOS transistor MN12 and the gate terminal of the N-channel MOS transistor MN3 is represented by a bias node "BIASE". The source terminal of the N-channel MOS transistor MN12 is connected to the drain of an N-channel MOS transistor MN14 having a gate terminal to which is input a signal obtained by inverting the power-down control signal PWDN by the inverter INV4. The source terminal of the N-channel MOS transistor MN14 is connected to the power supply VSS. When the power-down control signal PWDN is at LOW level, the N-channel MOS transistor MN14 turns on and the N-channel MOS transistor MN12 performs control in such a manner that a current proportional or equal to the current I2, which is the total of the currents that flow into the P-channel MOS transistors MP22, MP24 and MP26, will flow into the second constant-current source transistor MN3.

The bias control unit 2 further includes a P-channel MOS transistor MP27 having a drain terminal connected to the gate terminal of the N-channel MOS transistor MN2, a source terminal connected to the power supply VDD a gate terminal connected to the output end of the inverter INV4, and an N-channel MOS transistor MN15 having a drain terminal connected to the gate of the N-channel MOS transistor MN3, a source terminal connected to the power supply VSS and a gate terminal to which the power-down control signal PWDN is connected.

When the power-down control signal PWDN is at LOW level (the bias control unit 2 is active), the P-channel MOS transistor MP27 and N-channel MOS transistor MN15 are both turned off.

When the power-down control signal PWDN is at HIGH level (the bias control unit 2 is inactive), the P-channel MOS transistor MP27 and N-channel MOS transistor MN15 are both turned on so that the gate bias voltages of the N-channel MOS transistors MN2 and MN3 are supplied.

The P-channel MOS transistors MP11, MP12 and MP13 act as constant-current sources when the power-down control signal PWDN is at LOW level. Since the ratios of gate width (W) to gate length (L) of these transistors are 2/0.8, 4/0.8, 8/0.8 (micron units), respectively, the ratio among the drain currents (proportional to W/L) is 2:4:8. The ratios among the current driving capabilities of the P-channel MOS transistors MP21 and MP22, P-channel MOS transistors MP23 and MP24 and P-channel MOS transistors MP25 and MP26 are made 5:10:20, that is, 1:2:4.

When the power-down control signal PWDN is at HIGH level, the P-channel MOS transistors MP11, MP12 and MP13 turn off, the N-channel MOS transistors MN13 and MN14 also turn off, the current paths are severed and the bias control unit 2 ceases operating and is placed in a standby state. At this time the P-channel MOS transistor MP27 and N-channel MOS transistor MN15 turn on so that the gate bias voltages of the N-channel MOS transistors MN2 and MN3 are supplied.

When the power-down control signal PWDN is at LOW level, the P-channel MOS transistors MP11, MP12 and MP13 turn on, the N-channel channel MOS transistors MN13 and MN14 also turn on and the P-channel MOS transistor MP27 and N-channel MOS transistor MN15 both turn off.

When the power-down control signal PWDN is at LOW level, the bias control unit 2 operates in the manner described in connection with FIG. 1 and the output terminal OUT delivers an output signal having a phase decided by a value obtained by internally dividing the phase difference between the signals FINO, FINE of mutually different phase, which are input to the waveform synthesis unit 1, at a ratio conforming to the 3-bit control signal (SEL0, SEL1 and SEL2). The output terminal OUT may be provided with a waveshaping inverter or a non-inverting buffer.

In FIG. 2, the number of P-channel MOS transistors is three and the number of control signals SEL0 to SEL2 is three merely for the sake of simplifying the description, and it goes without saying that the present invention is not limited to such an arrangement.

Further, in the waveform synthesis unit 1, it is permissible to reverse the order of the connection of the N-channel MOS transistors MN2 and MN4 composing the series circuit inserted between the node N1 and power supply VSS and the order of the connection of the N-channel MOS transistors MN3 and MN5 composing the series circuit inserted between the node N1 and power supply VSS. In other words, it goes without saying that the from the side of node N1, the serial connections may be N-channel MOS transistors MN4 and MN2, and N-channel MOS transistors MN5 and MN3.

Described next as a third embodiment of the invention will be the structure of a DLL in which the interpolating circuit according to the invention described with reference to FIGS. 1 and 2 is used for the fine delay circuit (FDL: Fine Delay Line). FIG. 3 is a circuit illustrating the structure of the third embodiment.

As shown in FIG. 3, the DLL includes the delay circuit 10 (coarse delay line CDL), which is constructed by cascade-connecting a plurality of delay elements 101 to 102n, for outputting signals of different delay times from respective ones of taps by delaying an input signal applied thereto; a multiplexer 20o for selecting and outputting a signal "odd" from an odd-numbered tap of the delay circuit 10; a multiplexer 20e for selecting and outputting a signal "even" from an even-numbered tap of the delay circuit 10; a fine delay circuit 30, to which outputs from the first and second multiplexers 20o and 20e are input as first and second signals, respectively, for finely adjusting delay time; a phase detector 50, to which the output signal of the fine delay circuit 30 and the input signal are input, for detecting phase lag/lead; and a counter 40 for counting up/down based upon an output from the phase detector 50. The multiplexers 20o and 20e select an even-numbered tap and an odd-numbered tap, respectively, of the delay circuit 10 based upon an output from the counter 40. The interpolating circuit in accordance with the embodiments described in connection with FIGS. 1 and 2 constitutes the fine delay circuit 30. The signals SEL0, SEL1 and SEL2 that set the interior division ratio are supplied to the fine delay circuit 30 as the three lower order bits of the count of counter 40. In response, the fine delay circuit 30 changes over the current values, supplies bias voltages of the constant-current sources and adjusts the speed at which current is pulled from the node OUT, thereby finely adjusting the phase of the output signal.

The control signal that the counter 40 supplies to the multiplexers 20o and 20e is composed of the higher order bits (i.e., the bits from which the three lower order bits are excluded) of the counter 40.

Figure 9A:
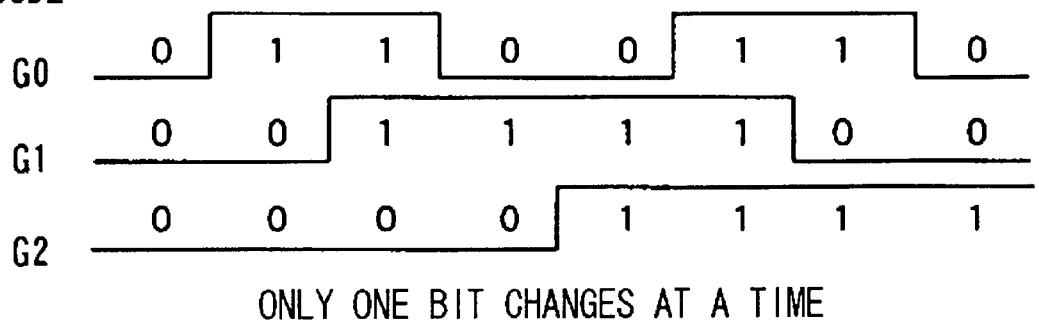
FIG. 9a is a diagram useful in describing a Grey code.

The code of the control signal according to which the multiplexers 20o and 20e select the taps of the delay circuit 10 is a Grey code, as shown in FIG. 9a.

The Grey code is such that only one bit changes at a time in the manner 000 . . . , 100 . . . , 110 . . . , 010 . . . , 011 . . . , 111 . . . , 101 . . . , 001 . . . , and therefore hazards do not occur.

Figure 9B:
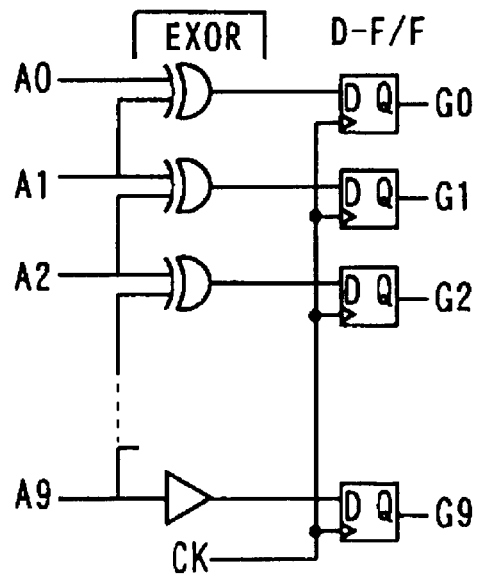
FIG. 9b is a diagram showing an example of a Grey code generating circuit.

FIG. 9b illustrates an example of a circuit for generating a Grey code from a binary code (the output of a binary counter). This circuit has exclusive-OR gates (EXOR) for taking the exclusive-OR of adjacent bit signals. The outputs of the exclusive-OR gates are applied to D-type flip-flops.

Figure 10A:
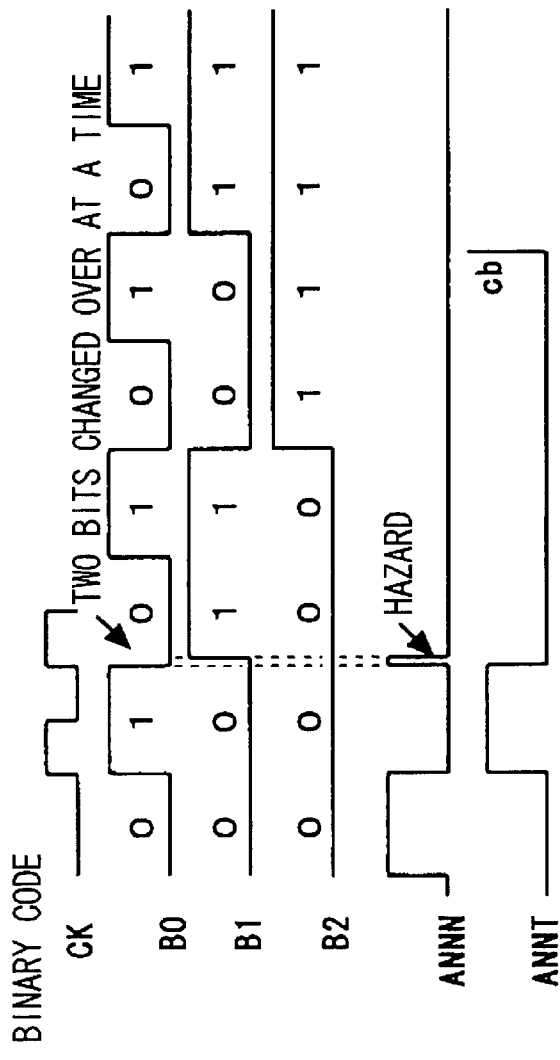
FIG. 10a is a diagram useful in describing generation of a hazard in a binary code.
Figure 10B:
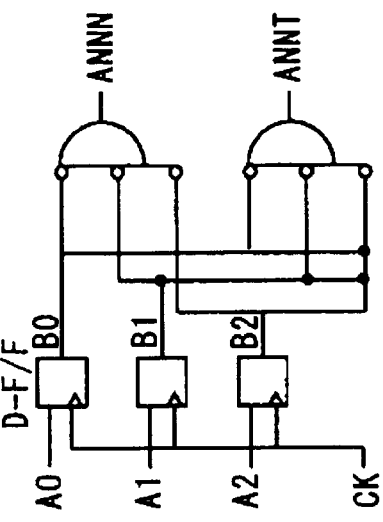
FIG. 10b is a diagram showing the structure of a circuit for generating a tap changeover signal by a binary code.

By contrast, in the case of a binary code, the bits change in the manner 000 . . . , 100 . . . , 010 . . . , 110 . . . , 001 . . . , 101 . . . , 011 . . . , 111 . . . . Since two bits change simultaneously, as shown in FIG. 10a, a glitch (hazard) occurs at the output ANNN of a circuit of the kind shown in FIG. 10b. The signal ANNN is the output signal of a logic circuit that outputs HIGH level when B0, B1, and B2 are all at LOW level. A glitch is produced owing to a delay in a case where B0 changes from High to LOW level and B1 from Low to HIGH level at the rising edge of the clock CK input to the D-type flip-flop.

With reference again to FIG. 3, a delay-step control circuit 60 is a control circuit for varying the counting step of the counter 40. A signal indicating phase lead/lag is produced by the phase detector 50 and input to the counter 40, which proceeds to count up or down. The counter 40 counts up or down in accordance with the size of the step set by the delay-step control circuit 60. Control of the counting step by the delay-step control circuit 60 may be performed as follows: Assume that the delay circuit 10 is composed of 128 delay elements. The initial setting will be such that eight of the delay elements constitute one step, with precision then being raised successively one delay element at a time. Lock control is carried out with the interior division ratio of the interpolating circuit constituting the fine delay circuit 30 being one step unit. That is, in the interpolating circuit (see FIGS. 1 and 2) constituting the fine delay circuit 30 shown in FIG. 3, the inputs are the delayed outputs of the even- and odd-numbered taps of the delay circuit 10 as selected by the multiplexers 20o and 20e, interpolation of phase in one step units is carried out based upon the first to third bits (values 0 to 7; SEL0 to SEL2 in FIGS. 1, 2) of the count in counter 40, and a phase comparison is carried out between the reference clock and the clock (referred to as an "internal clock"), which is output from the fine delay circuit 30, in order from value 0 (up to a maximum value of 7), by way of example.

Figure 15:
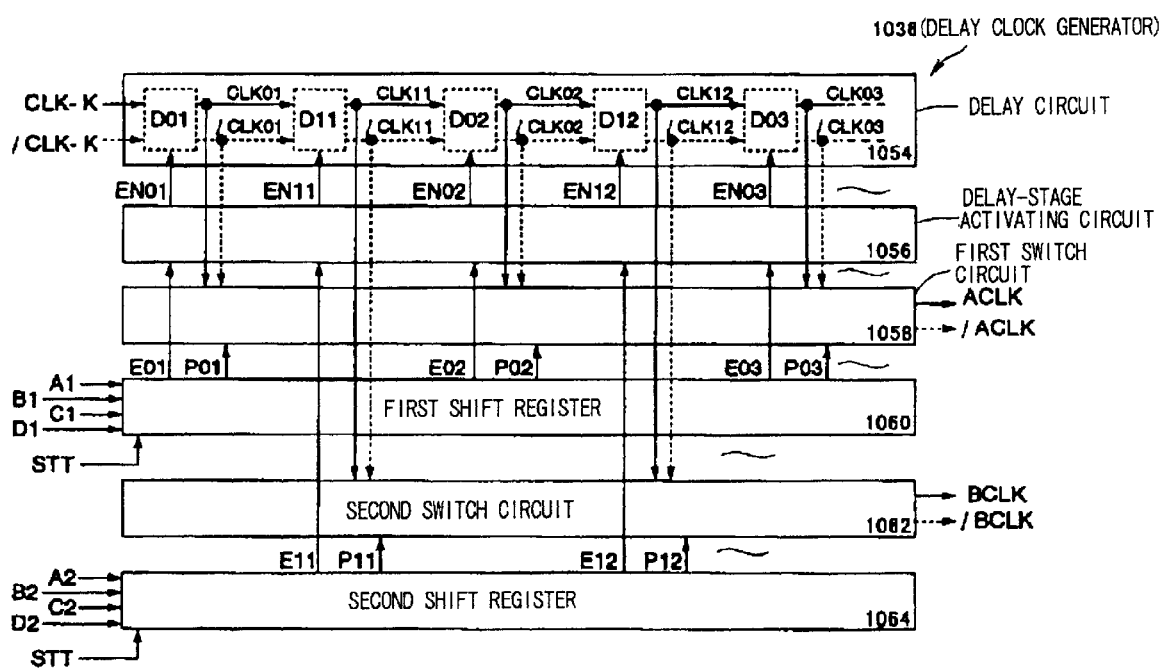
FIG. 15 is a diagram illustrating the structure of a clock delay circuit using a shift register according to the prior art.

In this embodiment having the above-described structure, time until locking is achieved is shortened in comparison with the shift-register arrangement (an example for comparison purposes) shown in FIG. 15. This will be described below. It will be assumed that the delay circuit 10 is composed of 128 delay elements.

Figure 13:
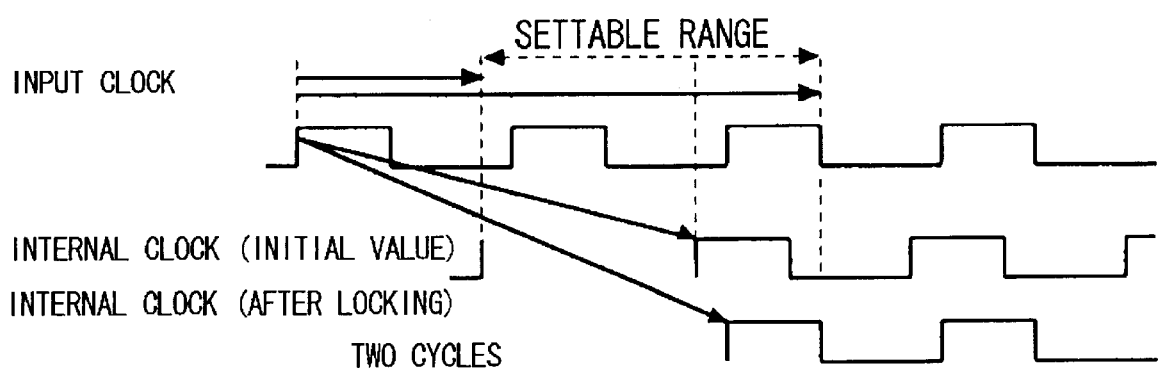
FIG. 13 is a diagram useful in describing the lock operation of an arrangement that uses a shift register.
Figure 14:
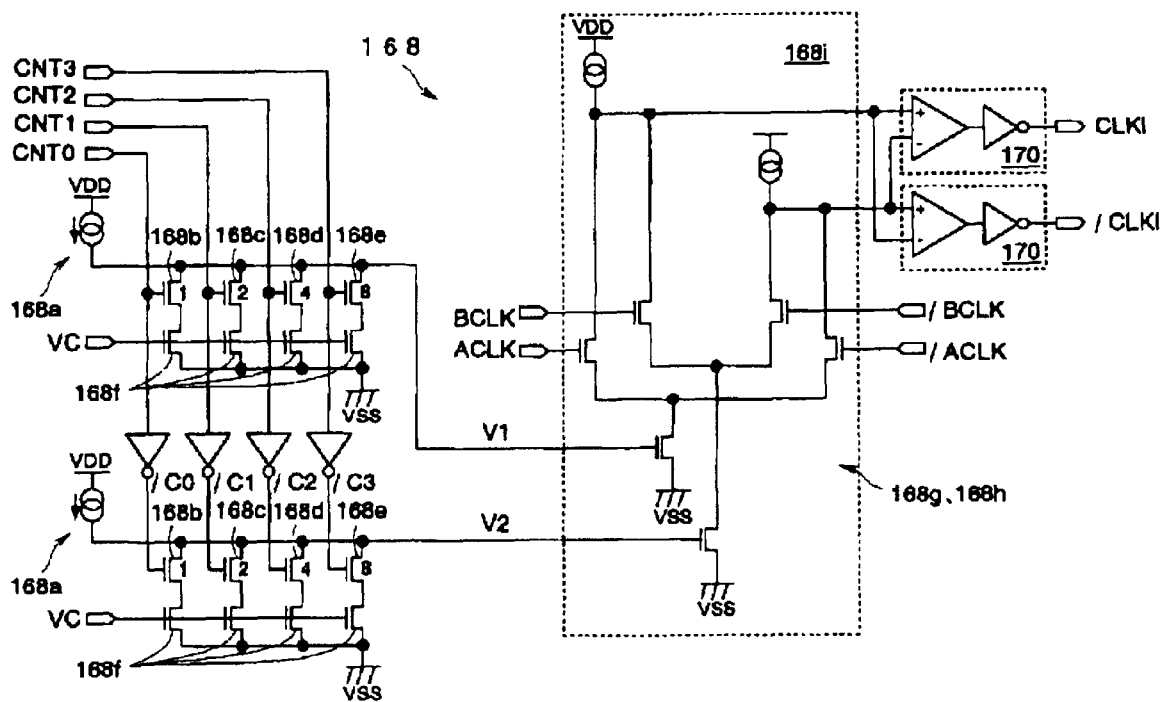
FIG. 14 is a diagram showing another structure of an interpolating circuit according to the prior art (Japanese Patent Kokai Publication JP-A-2001-56723)

If the initial value is set to the center tap in the comparative example in which the signal that selects the tap of the delay circuit 10 is obtained from a shift register, lock time is shortened but there are instances where DLL cycle delay is lengthened. As a consequence, a problem that arises is a fluctuation (that is proportional to propagation time) in delay time caused by noise or the like during propagation of the clock through the delay line. FIG. 13 is a diagram useful in describing the locking operation and cycle delay in the comparative example.

As shown in FIG. 13, cycle delay can be set synchronously in one cycle. However, if LOW level of the input clock (which corresponds to the reference clock signal of FIG. 3) is latched at the internal clock signal (the output signal of the fine delay circuit 30 in FIG. 3) in the phase detector (50 in FIG. 3), the cycle delay of the internal clock (after locking) may be two cycles.

Figure 5:
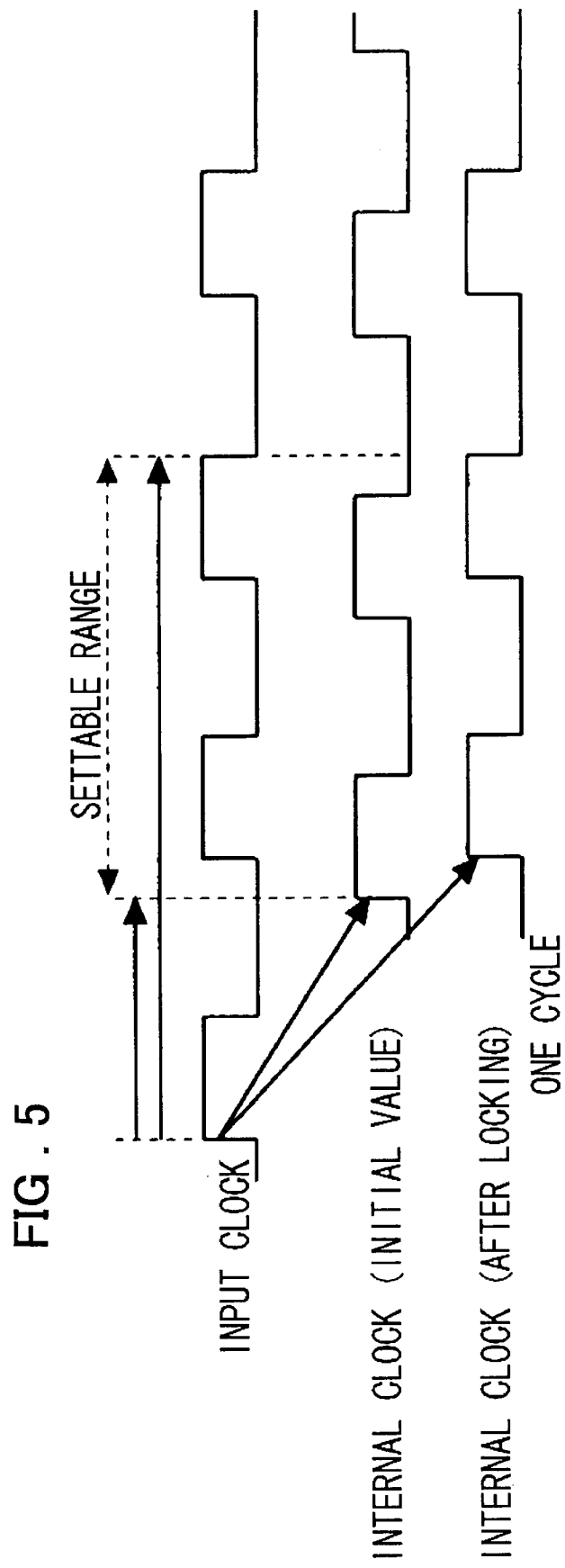
FIG. 5 is a diagram useful in describing the operation of a DLL circuit according to an embodiment of the present invention.

On the other hand, if the initial value of the counter 40 according to this embodiment is made 0, locking time lengthens but cycle delay always takes on the minimum value (one cycle), as illustrated in FIG. 5. As a result, the fluctuation (proportional to propagation time) in delay time caused by noise or the like during propagation of the clock through the delay circuit 10 can be held to the minimum. FIG. 13 is a diagram useful in describing the locking operation and cycle delay according to this embodiment. In FIG. 5, the input clock signal corresponds to the reference clock signal in FIG. 3, and the internal clock signal corresponds to the output of the fine delay circuit 30 in FIG. 3.

If the circuit that outputs the tap selection signal is implemented by a shift register (see FIG. 15) instead of the counter 40, as in the comparative example, and the initial value is made 64 at the center point, then, in the worst case, the phase comparison by the phase detector 50 is performed 64+7=71 times to achieve locking when the lock point is 0 or 128.

The phase detector 50 to achieve locking performs a phase comparison. The "+7" of "64+7" is the number of phase comparisons required to achieve phase matching in the interpolating circuit (see FIGS. 1 and 2) constituting the fine delay circuit 30. That is, in the worst case, seven steps are required in the interpolation operation performed by the interpolating circuit (FIGS. 1, 2).

Further, if the initial value of the shift register is made zero in order to achieve synchronization with the minimum cycle delay in the comparative example in which the circuit that outputs the tap selection signal is constituted by the shift register, then, in the worst case, the phase comparison by the phase detector 50 is performed 128+7=135 times to achieve locking when the lock point is 128.

By contrast, in the above-described embodiment, if the initial value of the counter 40 is made zero and the lock point is, e.g., 121, then, in the worst case, the phase comparison by the phase detector 50 is performed $$128/8 + 7/1 + 7 = 16 + 7 + 7$$
$$= 30$$

times to achieve locking. The "8" in this "128/8" is the number of tap changeover operations in units of 8 delay elements. This unit of the number of delay elements in tap changeover is set in the counter 40 from the delay-step control circuit 60 (see FIG. 3). Upon receiving this output from the phase detector 50, the counter 40 counts up (or down) in eight steps. Further, the "1" in "7/1" corresponds to the number of tap changeover operation in units of one delay element of the delay circuit 10. That is, the counter 40 counts up eight times in units of eight delay elements until 128 is reached, then counts down in units of one delay element until 121 is reached. The "+7" is the number of phase comparisons required to achieve phase matching in the interpolating circuit (see FIGS. 1 and 2) constituting the fine delay circuit 30. In other words, in the worst case, seven steps are required in the interpolation operation performed by the interpolating circuit (FIGS. 1, 2).

The length of time (referred to also as the "response") from the moment the value in counter 40 changes owing to phase detection by the phase detector 50 to the moment a clock based upon this delay time is output from the delay circuit 10 is close to 10 ns. If the response is three cycles and the margin thereof two cycles in a DDR-II-DRAM having a 3.3-ns clock cycle, the lock time will be 71 times×5=355 cycles with an arrangement (the comparative example) that uses a shift register. This does not satisfy the specified value of 200 cycles. In accordance with the present invention, on the other hand, the lock time is 30 times×5=150 cycles, which satisfies the specifications.

Furthermore, in the DLL of this embodiment, the tap changeover signal that is output from the counter 40 is in the form of a Grey code. When tap changeover is performed, therefore, hazards do not occur, stable operation is achieved and reliability improved.

A fourth embodiment of the present invention will now be described with reference to FIG. 4, which illustrates the structure of a DLL used in a DDR-SDRAM.

As shown in FIG. 4, the DDL includes an input buffer 80 to which an input signal is applied; the delay circuit 10 for delaying the output of the input buffer 80 and outputting signals having different delay times from respective ones of a plurality of taps; the multiplexer 20o for selecting and outputting a signal "odd" from an odd-numbered tap of the delay circuit 10; the multiplexer 20e for selecting and outputting a signal "even" from an even-numbered tap of the delay circuit 10; the fine delay circuit 30, to which the outputs (odd, even) from the first and second multiplexers 20o and 20e are input as first and second signals, respectively, for finely adjusting delay time; a multiplexer 70 for selecting read-out data (read-out data from a memory cell array, not shown) based upon the output signal (edge) of the fine delay circuit 30; an output buffer 90, to which the output of the multiplexer 70 in input, for outputting the same as DQj; a dummy multiplexer 71, to which the output signal of the fine delay circuit 30 is input, for delaying this signal by the delay time of the multiplexer 70; dummy buffers 91 and 81 having delay times equal to those of the output buffer 90 and input buffer 80, respectively; the phase detector 50, to which the output clock of the input buffer (80) and the output signal of the input buffer (81) are input, for detecting lag/lead of these two signals; and the counter 40 for counting up/down based upon an output from the phase detector 50. The multiplexers 20o and 20e select even- and odd-numbered taps, respectively, of the delay circuit 10 based upon an output from the counter 40. The fine delay circuit 30 is constituted by the above-described interpolating circuit. The signals SEL0, SEL1 and SEL2 that set the interior division ratio are supplied to the fine delay circuit 30 as the three lower order bits of the count of counter 40. In response, the fine delay circuit 30 changes over the current values, supplies bias voltages of the constant-current sources and adjusts the speed at which current is pulled from the node OUT, thereby finely adjusting the phase of the output signal.

In this embodiment also, in a manner similar to that of the third embodiment, the control signal that the counter 40 supplies to the multiplexers 20o and 20e is composed of the higher order bits (i.e., the bits from which the three lower order bits are excluded) of the counter 40. The code of the control signal according to which the multiplexers 20o and 20e select the taps of the delay circuit 10 is a Grey code. The counter is implemented in the form of a Grey code counter. In the DLL of this embodiment, the tap changeover signal output from the counter 40 is in the form of a Grey code. When tap changeover is performed, therefore, hazards do not occur. It goes without saying that this embodiment may be provided with the delay-step control circuit 60 shown in FIG. 3.

FIG. 6 is a block diagram showing the connections among coarse delay lines (CDL), multiplexers (MUX), which selectively output odd- and even-phase signals from the outputs of the coarse delay lines, and a fine delay circuit (FDL) in the DLL arrangements shown in FIGS. 3 and 4. The delay circuit 10 illustrated in FIGS. 3 and 4 corresponds to coarse delay lines (CDL) 101 to 104, and the fine delay circuit 30, which corresponds to an FDL 110, is the interpolating circuit described with reference to FIGS. 1 and 2.

As shown in FIG. 6, the CDL 101 outputs signals having a 0th odd phase COUTO0 and a 0th even phase COUTE0; the CDL 101, to which the output of CDL 101 is input, outputs signals having a first odd phase COUTO1 and a first even phase COUTE1; the CDL 103, to which the output of CDL 102 is input, outputs signals having a second odd phase COUTO2 and a second even phase COUTE2; and the CDL 104, to which the output of CDL 103 is input, outputs signals having a third odd phase COUTO3 and a third even phase COUTE3. The 0th to 3rd odd phase signals COUTO0 to COUTO3 are input to the multiplexer 105, which selects one of these signals in accordance with a selection signal that is the output of the counter. The 0th to 3rd even phase signals COUTE0 to COUTE3 are input to the multiplexer 106, which selects one of these signals in accordance with a selection signal that is the output of the counter. The outputs of the multiplexers 105 and 106 are input to the multiplexers 107, 108, respectively, of the succeeding stage, and the outputs of the multiplexers 107, 108 are input to the interpolating circuit 110.

Figure 7:
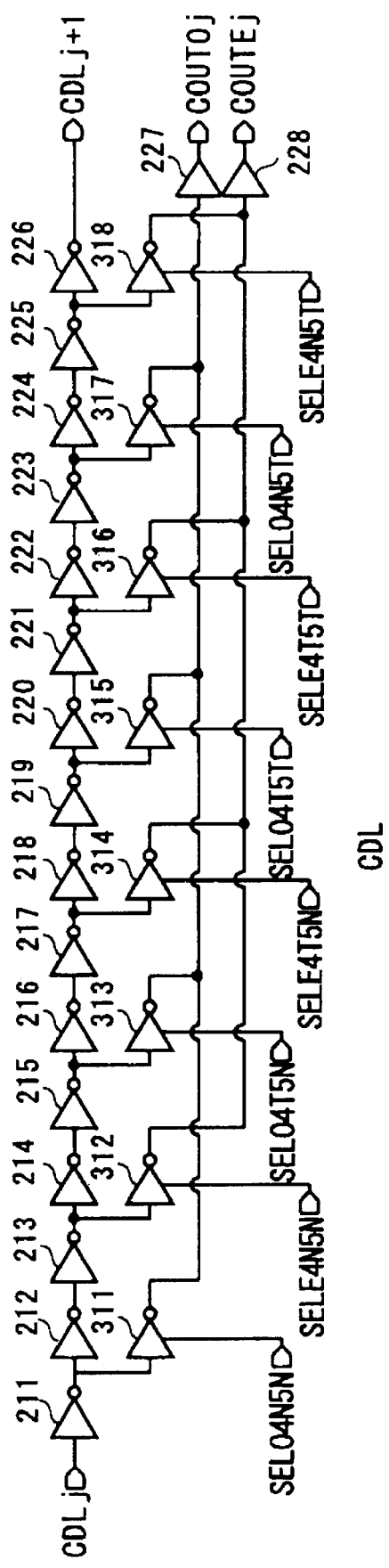
FIG. 7 is a diagram illustrating the structure of a coarse-adjustment delay circuit (CDL) according to an embodiment of the present invention.

FIG. 7 is a diagram illustrating the structure of one stage of the coarse delay line (CDLj) shown in FIG. 6. Here there are eight delay stages. Specifically, seven pairs of inverters are serially connected to the output side of an inverter 211 to which an input signal CDLj is applied, an inverter 226 is connected to the end of this series circuit and the output side of the inverter 226 is connected to an output terminal, which outputs a signal CDLj+1.

Also connected to the output side of the inverter 211 to which the input signal CDLj is applied is a tri-state inverter 311. The outputs of even-numbered pairs of the inverters (214 and 215; 218 and 219; 222 and 223) constructing delay stages are connected to the output node of the tri-state inverter 311 and to a buffer 227 via tri-state inverters 313, 315, and 317, respectively. The output of the buffer 227 is connected to an odd-numbered phase output terminal COUTOj. The output of the pair of inverters 212, 213 constituting one delay stage is connected to a tri-state inverter 312. The outputs of odd-numbered pairs of the inverters (216 and 217; 220 and 221; 224 and 225) constructing delay stages are connected to the output of the tri-state inverter 312 and to a buffer 228 via tri-state inverters 314, 316, and 318, respectively. The output of the buffer 228 is connected to an even-numbered phase output terminal COUTEj.

Control signals SEL04N5N to SELE4N5T that control output-enable of the tri-state inverters select one of the tri-state inverters 311, 313, 315, and 317 and one of the tri-state inverters 312, 314, 316, and 318.

Figure 8:
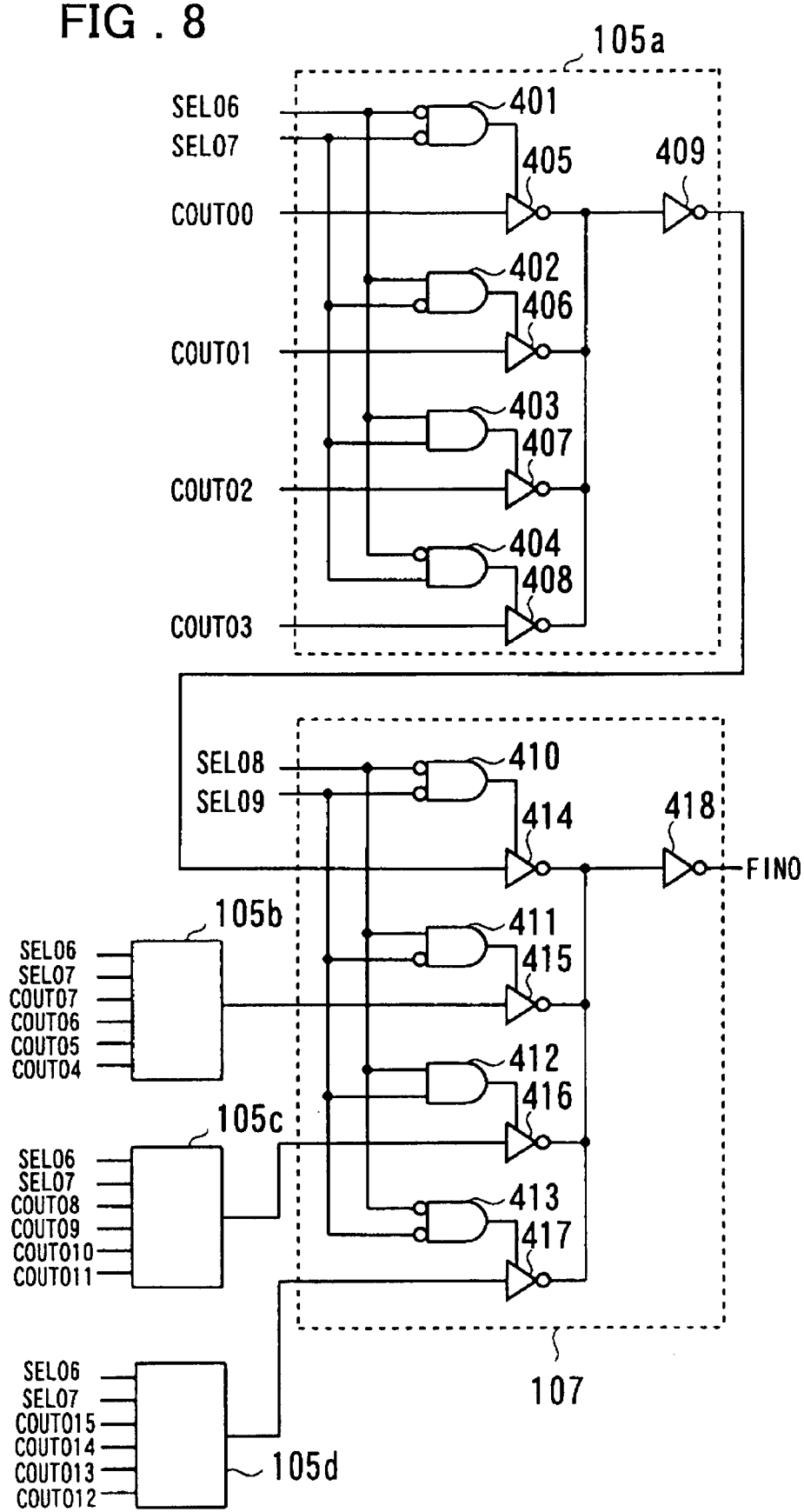
FIG. 8 is a diagram illustrating the structure of a multiplexer according to an embodiment of the present invention.

FIG. 8 is a diagram illustrating the structure and connection relationship of the multiplexers (MUX) shown in FIG. 6. As shown in FIG. 8, a multiplexer 105a selects one of 0th to 3rd odd-phase signals COUTO0, COUT01, COUTO2, and COUTO3 by two selection signals SELO6 and SELO7 of one bit each.

A multiplexer 105b selects one of 7th to 4th odd-phase signals COUTO7, COUT06, COUTO5, and COUTO4 by the two selection signals SELO6 and SELO7 of one bit each.

A multiplexer 105c selects one of 8th to 11th odd-phase signals COUTO8, COUT09, COUTO10, and COUTO11 by the two selection signals SELO6 and SELO7 of one bit each.

A multiplexer 105d selects one of 15th to 12th odd-phase signals COUTO15, COUT014, COUTO13, and COUTO12 by the two selection signals SELO6 and SELO7 of one bit each.

The multiplexer 107 selects one output from the four multiplexers 105a, 105b, 105c, and 105d by two selection signals SELO8 and SELO9 of one bit each.

It should be noted that the code of the selection signals SELO6 and SELO7 is a Grey code and therefore the orders (arrays) of input signals to the multiplexer 105b and multiplexer 105d are in reverse.

Figure 11:
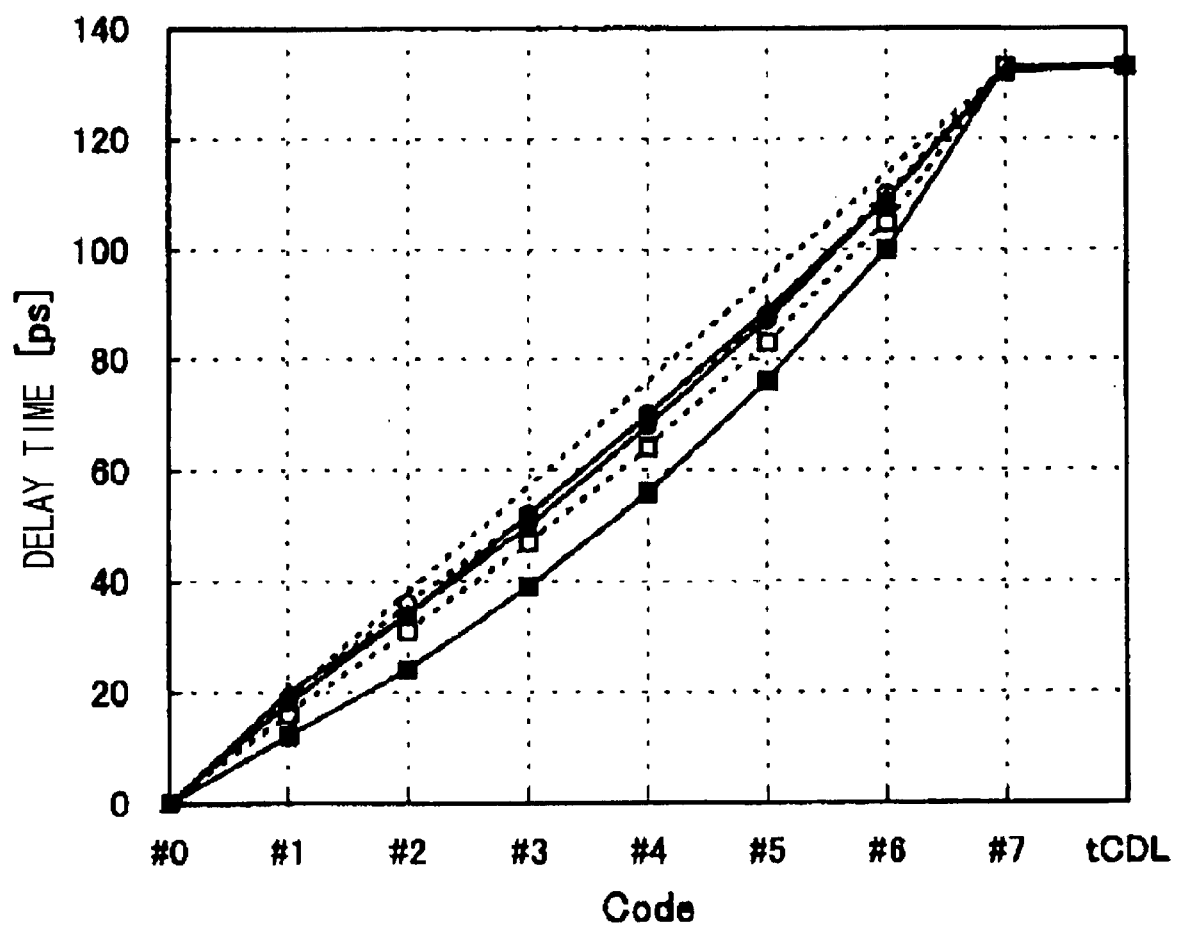
FIG. 11 is a diagram useful in describing the characteristic of an interpolating circuit according to an embodiment of the present invention.
Figure 12:
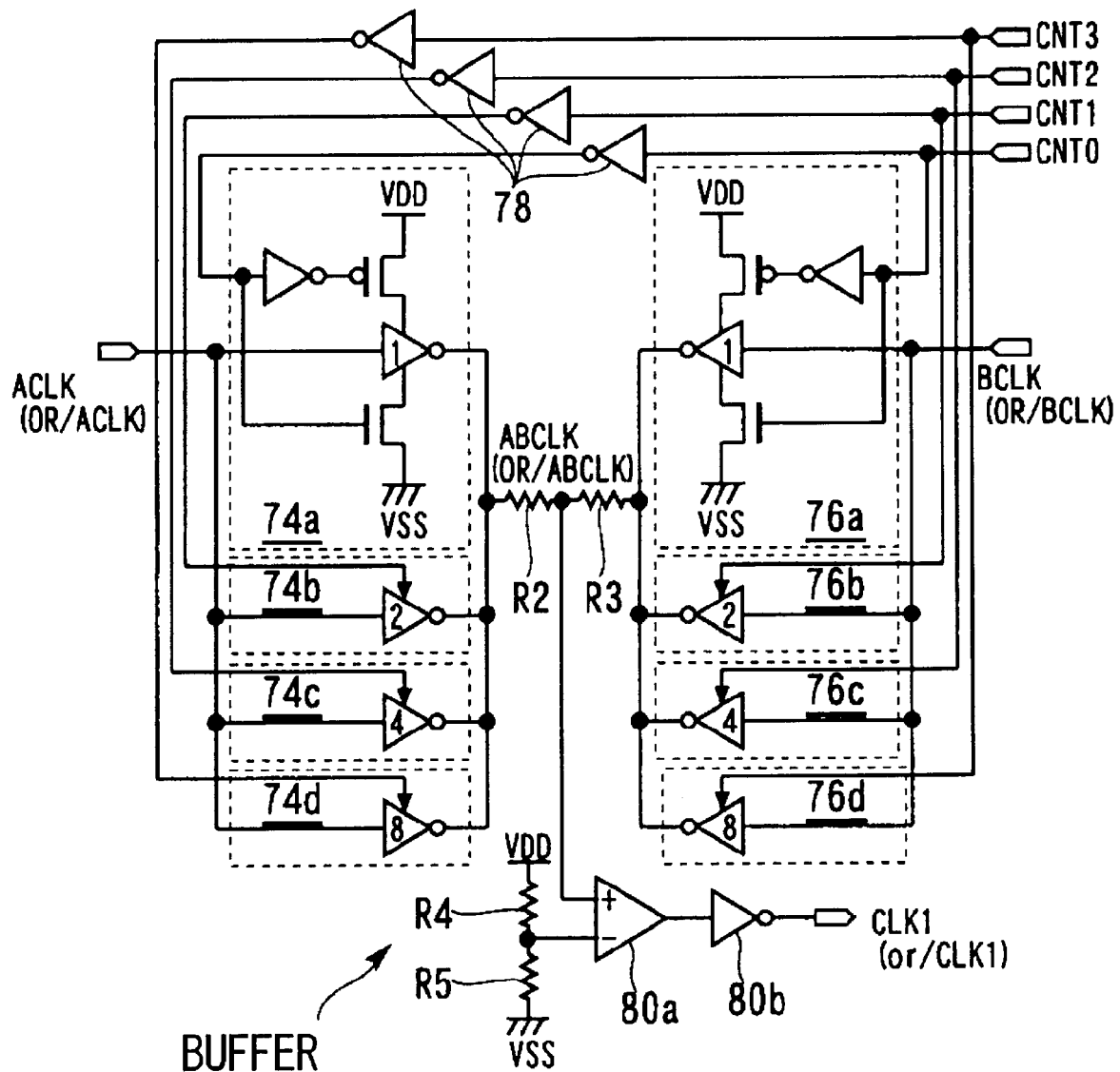
FIG. 12 is a diagram showing the structure of an interpolating circuit according to the prior art (Japanese Patent Kokai Publication JP-A-2001-56723)

FIG. 11 is a diagram illustrating the result obtained by analyzing the characteristic (linearity) of the interpolating circuit shown in FIG. 2. The black circles, white circles, black squares and white squares in FIG. 11 indicate a change in delay time with each of #0 to #7 codes (decided by control signals SEL0 to SEL2 in FIG. 2), in which transistor size serves as a parameter. The straight line indicated by the dotted line in FIG. 11 indicates ideal values. It will be understood from FIG. 11 that with the interpolating circuit according to this embodiment, the delay time of the output signal is linear, which coincides with the ideal value indicated at code #7.

Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

In accordance with the present invention, as described above, there is provided an interpolating circuit comprising a waveform synthesis unit and a bias control unit. The waveform synthesis unit includes a first switch inserted between a node, which is connected to an output terminal from which an output signal is delivered, and a first power supply; means for placing the first switch in the ON state when first and second signals are both a first logic value; a first series circuit composed by serial connection of a first constant-current source and a second switch placed in the ON state when the first signal is a second logic value; and a second series circuit composed by serial connection of a second constant-current source and a third switch placed in the ON state when the second signal is the second logic value. The first series circuit and the second series circuit are connected in parallel with each other between the node connected to the output terminal and a second power supply. The bias control unit sets values of current that flow into the first and second current sources of the waveform synthesis unit to values corresponding to the interior division ratio. As a result of this arrangement, highly precise interpolation can be achieved while power consumption is reduced.

Further, in accordance with a DLL according to the present invention, a Grey code is used as a tap changeover signal, thereby assuring that hazards will not occur when the output taps of a delay circuit are changed over. This makes it possible to achieve a reliable and stable operation.

Furthermore, in accordance with a DLL according to the present invention, the arrangement is such that the taps of a delay circuit (delay line) are changed over by the output of a counter. In comparison with a shift-register arrangement, therefore, the setting of an initial value can be achieved with the minimum cycles, thereby reducing the cycles necessary for locking.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. An interpolating circuit, receiving first and second signals, for generating an output signal having a phase corresponding to a value obtained by dividing a phase difference between the first and second signals in accordance with a preset interior division ratio, said interpolating circuit comprising a waveform synthesis unit and a bias control unit;

said waveform synthesis unit including:
a first switch element inserted between a node connected to an output terminal from which the output signal is delivered, and a first power supply;
means for placing said first switch element in an ON state when the first and second signals are both a first logic value;
a first series circuit composed by serial connection of a first current source and a second switch element placed in the ON state when the first signal is a second logic value; and
a second series circuit composed by serial connection of a second current source and a third switch element placed in the ON state when the second signal is the second logic value;
said first series circuit and said second series circuit being connected in parallel with each other between the node connected to the output terminal and a second power supply;
said bias control unit setting current values flowing through the first and second current sources of said waveform synthesis unit respectively to values conforming to the interior division ratio.

2. A delay-locked loop circuit comprising:
a delay circuit, receiving an reference signal, for delaying the reference signal and outputting signals having different delay times from respective ones of a plurality of taps;
first and second multiplexers for selecting and outputting signals from even-numbered taps and odd-numbered taps, respectively, of said delay circuit;

a fine delay circuit, receiving outputs from said first and second multiplexers as first and second signals, respectively, for outputting a signal of a finely adjusted delay time;

a phase detector, receiving an output signal of said fine delay circuit and the reference signal, for detecting a phase difference between the signals; and a counter in which a count value is varied based upon an output from said phase detector;

said first and second multiplexers selecting even-numbered taps and odd-numbered taps, respectively, of said delay circuit based upon an output from said counter;

said fine delay circuit comprising an interpolating circuit set forth in claim 1.

3. A delay-locked loop circuit comprising:

an input buffer circuit receiving an input signal applied thereto;

a delay circuit, receiving an output signal from said input buffer circuit, for delaying the signal and outputting signals having different delay times from respective ones of a plurality of taps;

first and second multiplexers for selecting and outputting signals from even-numbered taps and odd-numbered taps, respectively, of said delay circuit;

a fine delay circuit, receiving output signals from said first and second multiplexers as first and second signals, respectively, for outputting a signal of a finely adjusted delay time;

a third multiplexer for selectively outputting input data using an output of said fine delay circuit as a changeover signal;

an output buffer, receiving an output signal of said third multiplexer to output said output signal as output data;

a fourth multiplexer, receiving the output of said fine delay circuit, and having a delay time equivalent to that of said third multiplexer;

a first buffer, receiving an output of said fourth multiplexer, and having a dummy delay time equivalent to delay time of said output buffer;

a second buffer, receiving an output of said first buffer, and having a dummy delay time equivalent to delay time of said input buffer;

a phase detector, receiving an output signal of said second buffer and the input signal, for detecting a phase difference between these two signals; and a counter in which a count value is varied based upon an output from said phase detector;

said first and second multiplexers selecting even-numbered taps and odd-numbered taps, respectively, of said delay circuit based upon an output from said counter;

said fine delay circuit comprising an interpolating circuit set forth in claim 1.

4. The delay-locked loop circuit according to claim 2, further comprising means for varying steps by which said counter counts up and counts down.

5. The delay-locked loop circuit according to claim 2, wherein said interpolating circuit has a count value of predetermined bits output from said counter input thereto as a control signal for controlling a division ratio, said interpolating circuit outputting a signal corresponding to a phase obtained by dividing a phase difference between the first and second signals based upon the control signal.

6. The delay-locked loop circuit according to claim 2, wherein code of a control signal for changing over taps of said delay circuit comprises a Grey code in said first and second multiplexers.

7. The delay-locked loop circuit according to claim 2, wherein said counter outputs a Grey code as a count value.

8. The delay-locked loop circuit according to claim 2, wherein said delay circuit comprises a plural stage of coarse-adjustment delay circuits;

said first and second multiplexers for selecting the odd- and even-numbered taps each include:

a first stage of a plurality of multiplexers, which receives output signals of said plurality of coarse-adjustment delay circuits, for selecting one of a these signals of a plurality of successive taps; and a second stage of multiplexers that select one output of said plurality of multiplexers of the first stage;

signals of odd and even phases output from said multiplexers of the second stage being input to said interpolating circuit constituting said fine delay circuit.

9. A semiconductor integrating circuit device having an interpolating circuit set forth in claim 1.

10. A semiconductor integrating circuit device having a delay-locked loop circuit set forth in claim 2.

11. An interpolating circuit, receiving first and second signals, for generating an output signal having a phase corresponding to a value obtained by dividing a phase difference between the first and second signals in accordance with a interior division ratio set by an entered control signal, said interpolating circuit comprising a waveform synthesis unit and a bias control unit;

said waveform synthesis unit including:

a first switch element inserted between a node connected to an output terminal from which the output signal is delivered, and a first power supply;

means for placing said first switch element in an ON state when the first and second signals are both a first logic value;

a first series circuit composed by serial connection of a first current source and a second switch element placed in the ON state when the first signal is a second logic value; and a second series circuit composed by serial connection of a second current source and a third switch element placed in the ON state when the second signal is the second logic value;

said first series circuit and said second series circuit being connected in parallel with each other between the node connected to the output terminal and a second power supply;

said bias control unit including:

means for generating first and second currents, a current-value ratio of which conform to the interior division ratio, based upon the control signal; and means for performing control in such a manner that currents conforming to the current values of the first and second currents flow through the first and second current sources, respectively, of said waveform synchronizer.

12. The interpolating circuit according to claim 11, wherein said bias control unit includes:

a plural sets of circuits, each comprising a constant-current source and a pair of switch elements that includes one switch element having one end connected in common with said constant-current source and having a control terminal for receiving the control signal to turn said one switch element on and off, and another switch element having one end connected in common with said constant-current source and having a control terminal for receiving an inverted signal of the control signal to turn said another switch element on and off; and means for performing control in such a manner that, from among the pairs of switch elements of said plural sets of circuits, the sum total of currents that flow into one group of switch elements to the control terminals whereof the control signal is supplied is made the current value of said first current and a current value equal to the first current value flows into said first current source of the waveform synthesis unit; and in such a manner that, from among the pairs of switch elements of said plurality of circuits, the sum total of currents that flow into another group of switch elements to the control terminals whereof an inverted signal of the control signal is input is made the current value of the second current and a current value equal to the second current value flows into said second current source of the waveform synthesis unit.

13. The interpolating circuit according to claim 12, wherein current values of said constant-current sources of said plural sets of circuits are made weighted values for each of said plural sets of circuits.

14. The interpolating circuit according to claim 12, wherein from among the pairs of switch elements of said plural sets of circuits, the sum total of currents that flow into said one group of switch elements to the control terminals whereof the control signal is supplied flows into a diode-connected first transistor and said first transistor has a control terminal connected to a control terminal of a transistor constituting said first current source of the waveform synthesis unit; and the sum total of currents that flow into said another group of switch elements to the control terminals whereof an inverted signal of the control signal is input flows into a diode-connected second transistor and said second transistor has a control terminal connected to a control terminal of a transistor constituting said second constant-current source of the waveform synthesis unit.

15. The interpolating circuit according to claim 12, wherein said bias control unit has a power-down control signal input thereto and is so adapted that when the power-down control signal is activated to place said bias control unit in a standby state, a current path of said constant-current source of said bias control unit is turned off.

16. The interpolating circuit according to claim 15, further comprising means for supplying a predetermined bias to said first and second content current sources of said waveform synthesis unit when the power-down control signal is activated to place said bias control unit in the standby state.

17. An interpolating circuit, receiving first and second signals, for generating an output signal having a phase corresponding to a value obtained by dividing a phase difference between the first and second signals in accordance with a interior division ratio set by an entered control signal, said interpolating circuit comprising a waveform synthesis unit and a bias control unit;

said waveform synthesis unit including:
a first switch element inserted into a charging path of a node connected to an output terminal from which the output signal is delivered;
means for charging the node connected to the output terminal, by turning on said first switch element when the first and second signals are both a first logic value; and first and second discharge paths provided to correspond to the first and second signals, respectively, and connected to the node connected to the output terminal;
a first current source and a second switch element that is turned on and off based upon the first signal, being serially inserted into said first discharge path;
a second current source and a third switch element that is turned on and off based upon the second signal, being serially inserted into said second discharge path; and
at least one of the second switch element and third switch element being turned on to discharge said node connected to the output terminal, when at least one of the first signal and second signal is a second logic value;

said bias control unit controlling the bias of the first constant-current source and second constant-current source of said waveform synthesis unit and including:
means for generating a first current and a second current, which exhibit a current-value ratio that conforms to the interior division ratio, in response to two sets of current-path switches being turned on and off based upon the control signal; and
means for performing control in such a manner that currents corresponding to current values of respective ones of the first current and second current flow into respective ones of the first current source and second current source of said waveform synthesis unit.

18. An interpolating circuit, receiving first and second signals, for generating an output signal having a phase corresponding to a value obtained by dividing a phase difference between the first and second signals in accordance with a division ratio set by an entered control signal, said interpolating circuit comprising a waveform synthesis unit and a bias control unit;

said waveform synthesis unit including:
a logic circuit, receiving the first and second signals, for outputting the result of a predetermined logic operation applied to the first and second signals;
a first switch element, being inserted between a node connected to an output terminal from which the output signal is delivered and a first power supply, having a control terminal for receiving an output signal from said logic circuit to turn said first switch element on and off;
a first series circuit composed by serial connection of a first current source and a second switch element having a control terminal for receiving the first signal to turn said second switch element on and off; and
a second series circuit composed by serial connection of a second current source and a third switch element having a control terminal for receiving the second signal to turn said third switch element on and off;
said first series circuit and said second series circuit being connected in parallel with each other between the node connected to the output terminal and a second power supply;
said bias control unit controlling the bias of the first current source and second current source of said waveform synthesis unit and including:
means for generating a first current and a second current, which exhibit a current-value ratio that conforms to the interior division ratio, in response to two sets of current-path switches being turned on and off based upon the control signal; and means for performing control in such a manner that currents corresponding to current values of respective ones of the first current and second current flow into respective ones of the first current source and second current source of said waveform synthesis unit.

19. The interpolating circuit according to claim 18, further comprising:

a first precharge circuit for pre-discharging or precharging a connection node between said first current source and the second switch element; and a second precharge circuit for pre-discharging or pre-charging a connection node between said second current source and said third switch element.

20. The interpolating circuit according to claim 19, wherein said first precharge circuit comprises a fourth switch element inserted between said first power supply and a connection node between said first current source and said second switch element, having a control terminal for receiving the output of said logic circuit to turn said fourth switch element on and off; and said second precharge circuit comprises a fifth switch element, inserted between said first power supply and a connection node between said second current source and said third switch element, having a control terminal for receiving the output of said logic circuit to turn said fifth switch element on and off.

21. An interpolating circuit, having first and second input terminals for receiving first and second signals respectively, for generating and delivering from an output terminal, an output signal having a phase corresponding to a value obtained by dividing a phase difference between the first and second signals in accordance with a interior division ratio set by a control signal supplied from a control signal input terminal, said interpolating circuit comprising a waveform synthesis unit and a bias control unit;

said waveform synthesis unit including:

a logic circuit, receiving the first and second signals, for outputting a result as an output signal of a predetermined logic operation applied to the first and second signals;

a first transistor, inserted between a node connected to the output terminal and a first power supply, having a control terminal for receiving an output signal from said logic circuit to turn said first transistor on and off;

a first series circuit composed by serial connection of a first current source transistor and a second transistor having a control terminal for receiving the first signal to turn said second transistor on and off; and a second series circuit composed by serial connection of a second current source transistor and a third transistor having a control terminal for receiving the second signal to turn the third transistor on and off;

said first series circuit and said second series circuit being connected in parallel with each other between the node and a second power supply;

said bias control unit performing control, based upon a control signal that decides the interior division ratio, in such a manner that currents having current values conforming to the interior division ratio will flow into respective ones of the first and second current sources of said waveform synthesis unit;

said bias control unit having a plural sets of circuits each comprising a constant-current source transistor connected to the first power supply, a first switch transistor, inserted between said constant-current source transistor and a first node connected to the control terminal of said first constant-current source transistor, having a control terminal for receiving the control signal that decides the interior division ratio to turn said first switch transistor on and off, and a second switch transistor, inserted between said constant-current source transistor and a second node connected to the control terminal of said second constant-current source transistor, having a control terminal for receiving an inverted signal of the control signal that decides the interior division ratio to turn said second switch transistor on and off;

wherein connection points between the group of first switch transistors and said first node of said plural sets of circuits is connected to a diode-connected fourth transistor, and a control terminal of said diode-connected fourth transistor is connected in common to the control terminal of said first constant-current source transistor; and connection points between the group of second switch transistors and second node of said plural sets of circuits are connected to a diode-connected fifth transistor, and a control terminal of said diode-connected fifth transistor is connected in common to the control terminal of the second constant-current source transistor.

22. The interpolating circuit according to claim 21, wherein said bias control unit has a power-down control signal input thereto and is so adapted that when the power-down control signal is activated to place said bias control unit in a standby state, the constant-current source transistor connected to the first power supply in each of said plurality of circuits is turned off; and current paths between the diode-connected fourth and fifth transistors and the second power supply also are turned off;

said bias control unit having means for supplying a predetermined bias to said first and second current source transistors of said waveform synthesis unit.

* * * * *